US012713590B2

(12) United States Patent
Kim et al.

(10) Patent No.: US 12,713,590 B2
(45) Date of Patent: Aug. 18, 2026

(54) INTEGRATED CIRCUIT DEVICES

(71) Applicant: Samsung Electronics Co., Ltd., Suwon-si (KR)

(72) Inventors: Euna Kim, Suwon-si (KR); Eunjung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 559 days.

(21) Appl. No.: 18/341,921

(22) Filed: Jun. 27, 2023

(65) Prior Publication Data

US 2024/0040774 A1 Feb. 1, 2024

(30) Foreign Application Priority Data

Jul. 28, 2022 (KR) ........................ 10-2022-0094023

(51) Int. Cl.
*H10B 12/00* (2023.01)

(52) U.S. Cl.
CPC ........... *H10B 12/485* (2023.02); *H10B 12/02* (2023.02); *H10B 12/315* (2023.02); *H10B 12/34* (2023.02)

(58) Field of Classification Search
CPC ..... H10B 12/485; H10B 12/315; H10B 12/34
See application file for complete search history.

(56) References Cited

U.S. PATENT DOCUMENTS 5,014,096 A 5/1991 Matsuda et al.
5,723,575 A 3/1998 Gilon et al.
5,914,096 A 6/1999 Palmer et al.
6,106,804 A 8/2000 Palmer et al.
6,221,397 B1 4/2001 Russell-Jones et al.
6,291,640 B1 9/2001 Bailey et al.
6,822,064 B1 11/2004 Kulkarni et al.
7,153,933 B2 12/2006 Wu et al.
7,345,117 B1 3/2008 Barbucci et al.
7,365,055 B2 4/2008 Temsamani et al.
8,916,447 B2 12/2014 Park et al.
9,082,827 B2 7/2015 Yu et al.
9,724,367 B2 8/2017 Basu et al.
(Continued)

FOREIGN PATENT DOCUMENTS

CN 108695326 A * 10/2018 ............. H01L 21/71
CN 113284843 A 8/2021
(Continued)

*Primary Examiner* — Steven M Page
(74) *Attorney, Agent, or Firm* — Wolf, Greenfield & Sacks, P.C.

(57) ABSTRACT

An integrated circuit device includes a substrate and a plurality of cell patterns that have a pillar shape, wherein the plurality of cell patterns comprise a plurality of first cell groups that are arranged along a first horizontal direction and each comprise a plurality of first cell patterns arranged in a row along a second horizontal direction, and a plurality of second cell groups that are spaced apart from the plurality of first cell groups, are arranged along the first horizontal direction, and each comprise a plurality of second cell patterns arranged in a row along the second horizontal direction, and wherein respective side surfaces of the plurality of second cell patterns have respective concave portions that are recessed inward along respective side surfaces of the plurality of first cell patterns that are adjacent to respective ones of the plurality of second cell patterns.

20 Claims, 25 Drawing Sheets

(56) References Cited

U.S. PATENT DOCUMENTS

| | | | |
|---|---|---|---|
| 10,141,316 B2 | 11/2018 | Lee et al. | |
| 10,501,772 B2 | 12/2019 | Stern et al. | |
| 10,695,435 B2 | 6/2020 | Bentley et al. | |
| 11,226,552 B2 | 1/2022 | Ahn et al. | |
| 11,417,731 B2 | 8/2022 | Kim et al. | |
| 11,430,691 B2 | 8/2022 | Chang et al. | |
| 2018/0301459 A1* | 10/2018 | Kim | H10B 12/482 |
| 2019/0103302 A1* | 4/2019 | Yoon | H01L 21/76895 |
| 2020/0276261 A1 | 9/2020 | Zhao et al. | |
| 2022/0005811 A1 | 1/2022 | Kim et al. | |
| 2022/0052055 A1 | 2/2022 | Chun | |
| 2023/0057350 A1 | 2/2023 | Zhao et al. | |
| 2023/0115871 A1 | 4/2023 | Zhao et al. | |

FOREIGN PATENT DOCUMENTS

| | | |
|---|---|---|
| KR | 20200097295 A | 8/2020 |
| KR | 20210117302 A | 9/2021 |
| KR | 20220024914 A | 3/2022 |
| TW | 202145349 A | 12/2021 |

* cited by examiner 156
154
152
144
136
134
132
124
122
112
118
116
114
104
102
C
C'
106a
164
162
B
B'
106b
ACT
da1
t1
A
A'

INTEGRATED CIRCUIT DEVICES

CROSS-REFERENCE TO RELATED APPLICATION

This application is based on and claims priority under 35 U.S.C. § 119 to Korean Patent Application No. 10-2022-0094023, filed on Jul. 28, 2022, in the Korean Intellectual Property Office, the disclosure of which is incorporated by reference herein in its entirety.

BACKGROUND

The inventive concept relates to integrated circuit devices, and more particularly, to integrated circuit devices including conductive lines and contact plugs adjacent thereto.

Recently, as down-scaling of integrated circuit devices progresses rapidly, a gap between a plurality of conductive lines has been reduced, and thus, a separation distance between the plurality of conductive lines and a contact structure arranged in a relatively narrow space between the plurality of conductive lines has also gradually decreased. Accordingly, there is a need to develop technology for implementing a structure capable of maintaining the electrical reliability of a contact structure arranged in a relatively narrow space between a plurality of conductive lines.

SUMMARY

Aspects of the inventive concept may provide integrated circuit devices capable of maintaining electrical reliability even when an area of a device region is reduced with an increase in the integration of a semiconductor device.

According to aspects of the inventive concept, there is provided an integrated circuit device including a substrate that has a first active region and a second active region spaced apart from the first active region, a device isolation layer between the first active region and the second active region, a direct contact electrically connected to the first active region in a direct contact opening that extends through portions of the first active region and the device isolation layer, a plurality of cell patterns that have a pillar shape and extend from a lower surface of the direct contact opening on the second active region and, and a buried contact plug that extends through portions of the plurality of cell patterns and is electrically connected to the second active region, wherein the plurality of cell patterns comprise a plurality of first cell groups that are arranged along a first horizontal direction and each comprise a plurality of first cell patterns arranged in a row along a second horizontal direction perpendicular to the first horizontal direction, and a plurality of second cell groups that are spaced apart from the plurality of first cell groups, are arranged along the first horizontal direction, and each comprise a plurality of second cell patterns arranged in a row along the second horizontal direction, and wherein respective side surfaces of the plurality of second cell patterns have respective concave portions that are recessed inward along respective side surfaces of the plurality of first cell patterns that are adjacent to respective ones of the plurality of second cell patterns.

According to other aspects of the inventive concept, there is provided an integrated circuit device including a substrate that has a plurality of first active regions and a plurality of second active regions, a plurality of cell patterns that define a direct contact opening on one or more of the second active regions, include a plurality of first cell patterns that are arranged in a first horizontal direction and a second horizontal direction perpendicular to the first horizontal direction, and include a plurality of second cell patterns that are arranged in the first horizontal direction and the second horizontal direction and are spaced apart from the first cell patterns, a direct contact that extends through a gap-fill insulating pattern in the direct contact opening, and is electrically connected to one or more of the first active regions, a bitline that is electrically connected to the direct contact on the substrate and a buried contact plug that extends through portions of the plurality of cell patterns, and is electrically connected to one or more of the second active regions, wherein the plurality of second cell patterns are spaced apart from the plurality of first cell patterns that are adjacent thereto by at least a first separation distance, and wherein a planar area of each of the plurality of second cell patterns is less than a planar area of each of the plurality of first cell patterns.

According to other aspects of the inventive concept, there is provided an integrated circuit device including a substrate that has a first active region and a second active region spaced apart from the first active region, a device isolation layer between the first active region and the second active region, a direct contact electrically connected to the first active region in a direct contact opening that extends through portions of the first active region and the device isolation layer, a wordline that extends in a first horizontal direction on the substrate, and intersects the first active region and the second active region, a bitline that extends in a second horizontal direction perpendicular to the first horizontal direction on the substrate and is electrically connected to the direct contact, a capacitor that is on the bitline and is configured to store data, a plurality of cell patterns that have a pillar shape and extend from a lower surface of the direct contact opening on the second active region, and define the direct contact opening, a buried contact plug that extends through portions of the plurality of cell patterns, and is electrically connected to the second active region and a conductive landing pad that extends in a vertical direction on the buried contact plug, and electrically connects the buried contact plug and the capacitor to each other, wherein the plurality of cell patterns comprise a plurality of first cell groups that are arranged along the first horizontal direction and each comprise a plurality of first cell patterns arranged in a row along the second horizontal direction, and a plurality of second cell groups that are spaced apart from the plurality of first cell groups, are arranged along the first horizontal direction, and each comprise a plurality of second cell patterns arranged in a row along the second horizontal direction, wherein a planar area of each of the plurality of second cell patterns is less than a planar area of each of the plurality of first cell patterns, and wherein the plurality of second cell patterns are spaced apart from the plurality of first cell patterns that are adjacent thereto by at least a first separation distance.

BRIEF DESCRIPTION OF THE DRAWINGS

Example embodiments of the present disclosure will be more clearly understood from the following detailed description taken in conjunction with the accompanying drawings in which:

FIGS. 2A, 3A, 4A, 5A, 6A, 7A, 8A, and 10A are plan views illustrating a method of manufacturing a cell pattern of an integrated circuit device, according to some example embodiments, and FIGS. 2B, 3B, 4B, 5B, 6B, 7B, 8B, 9, and 10B are cross-sectional views taken along lines A-A', B-B', and C-C' of FIGS. 2A, 3A, 4A, 5A, 6A, 7A, 8A, and 10A, respectively.

DETAILED DESCRIPTION OF THE EMBODIMENTS

Figure 1A:
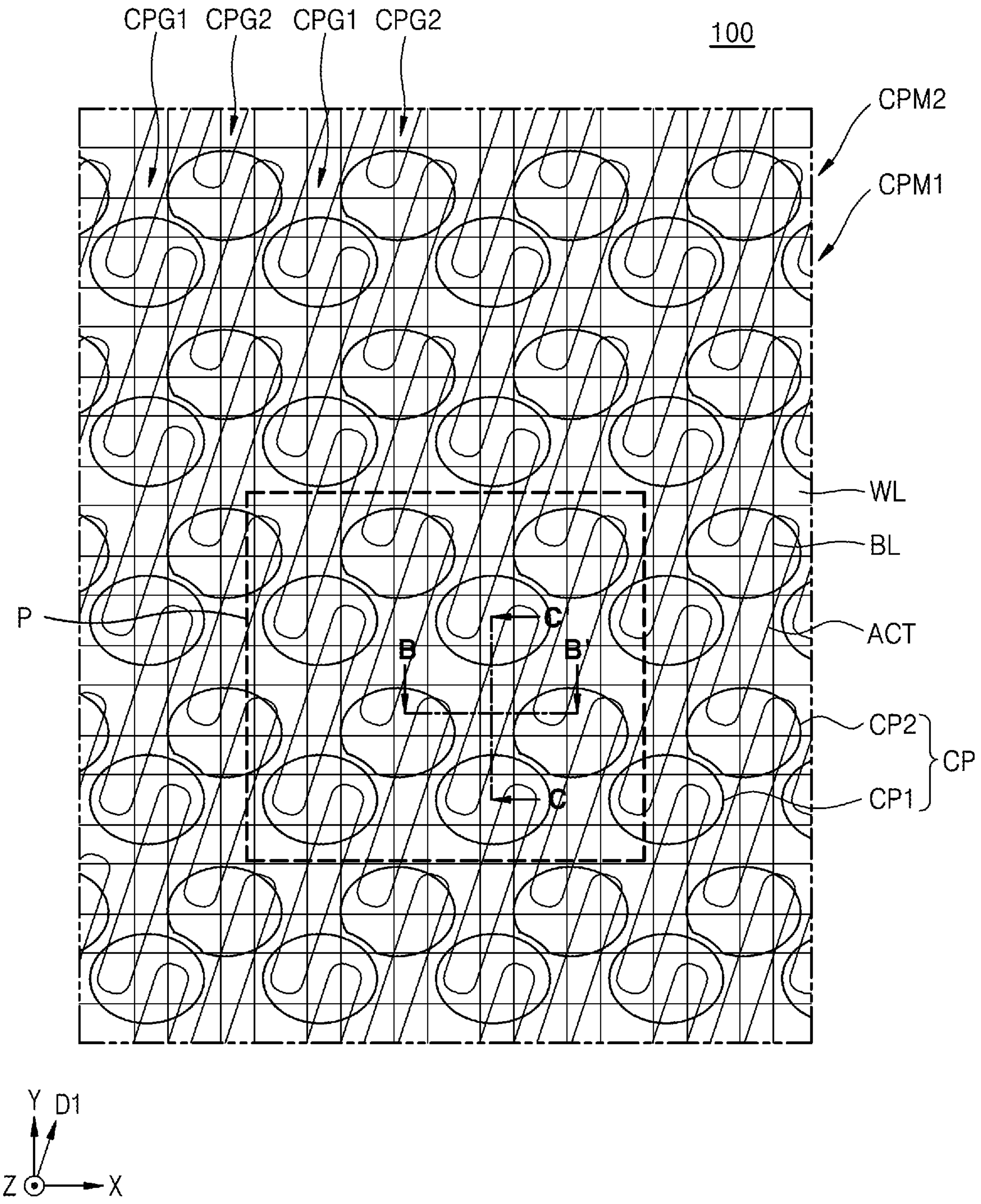
FIG. 1A is a layout diagram illustrating an integrated circuit device according to some example embodiments.

Hereinafter, example embodiments of the present disclosure will be described in detail with reference to the accompanying drawings. Like reference numerals in the drawings denote like elements, and thus their description will be omitted.

Figure 1B:
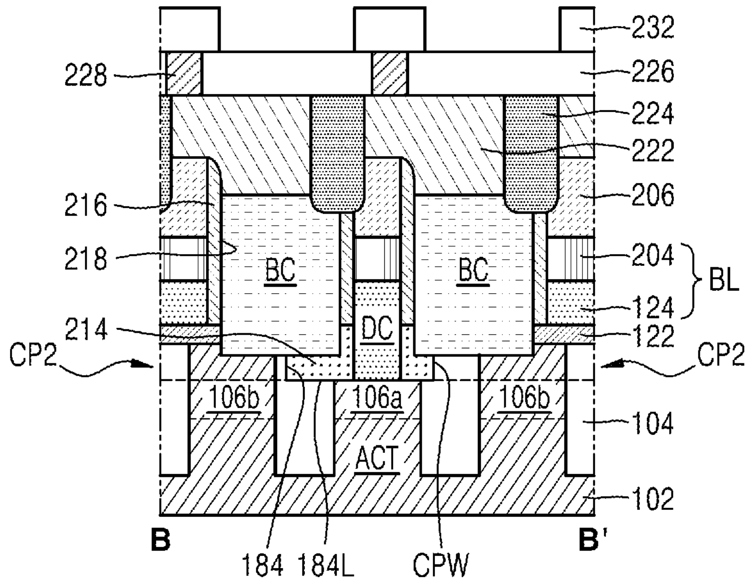
FIG. 1B is a cross-sectional view taken along line B-B' of FIG. 1A.
Figure 1C:
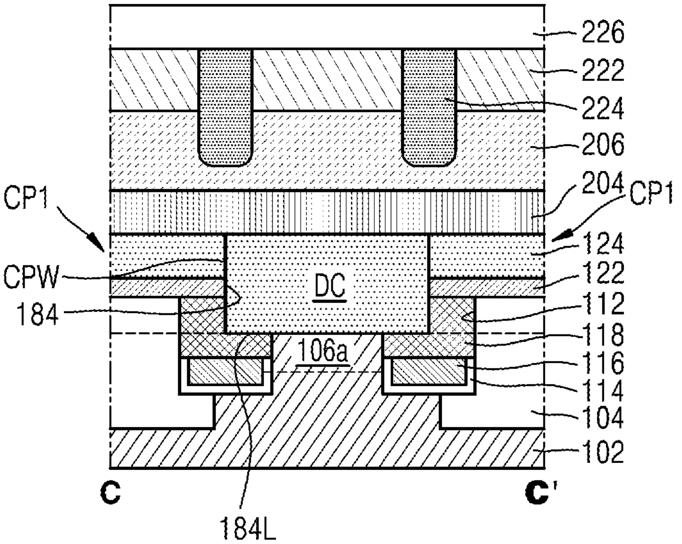
FIG. 1C is a cross-sectional view taken along line C-C' of FIG. 1A.
Figure 1D:
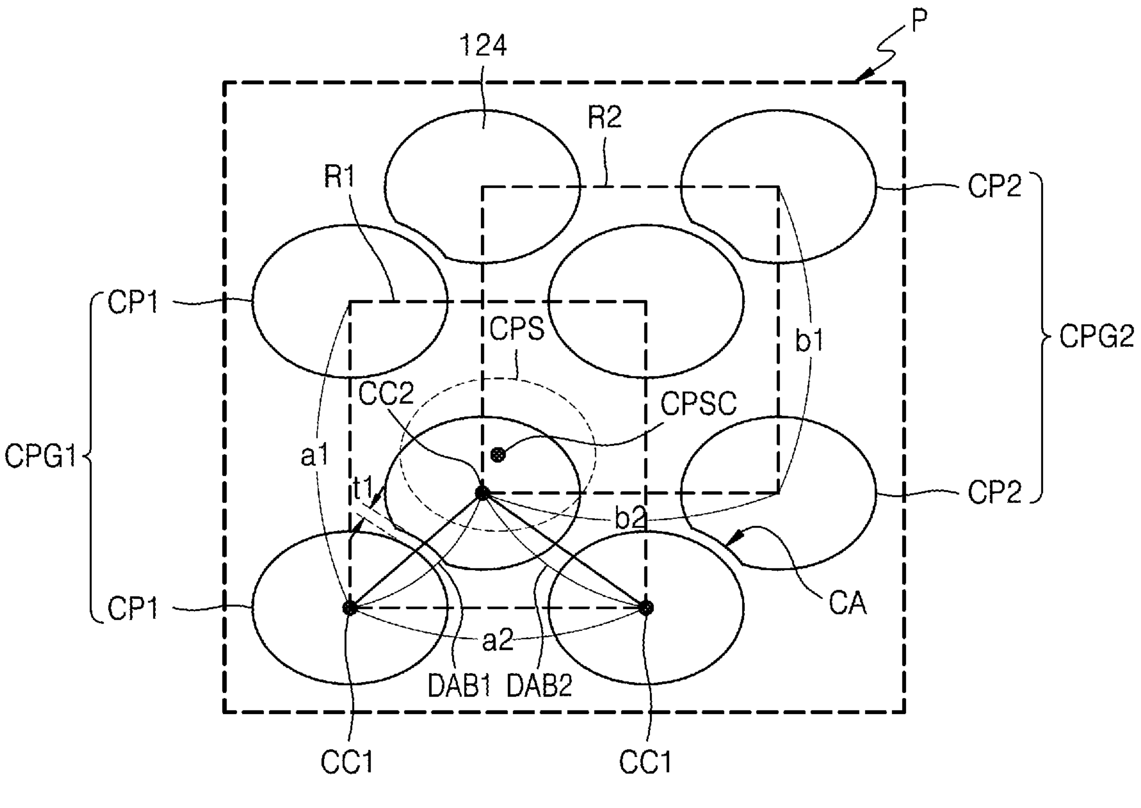
FIG. 1D is an enlarged view illustrating a region indicated by P of FIG. 1A.

FIG. 1A is a layout diagram illustrating an integrated circuit device 100 according to some example embodiments. FIG. 1B is a cross-sectional view taken along line B-B' of FIG. 1A. FIG. 1C is a cross-sectional view taken along line C-C' of FIG. 1A. FIG. 1D is an enlarged view illustrating a region indicated by P of FIG. 1A.

Referring to FIGS. 1A, 1B, 1C, and 1D, the integrated circuit device 100 may include a substrate 102 in which a plurality of active regions ACT are defined. The active regions ACT may include a first active region 106*a* and a second active region 106*b*. The plurality of active regions ACT may be spaced apart from each other by a device isolation layer 104.

According to some embodiments, the substrate 102 may include silicon, for example, single crystalline silicon, polycrystalline silicon, or amorphous silicon. According to some embodiments, the substrate 102 may include at least one selected from Ge, SiGe, SiC, GaAs, InAs, and/or InP. According to some embodiments, the substrate 102 may include conductive regions, for example, wells doped with impurities or structures doped with impurities. The device isolation layer 104 may include an oxide layer, a nitride layer, or a combination thereof.

According to some embodiments, the plurality of active regions ACT may be arranged in a diagonal direction D1 with respect to a first horizontal direction (an X direction) and a second horizontal direction (a Y direction) perpendicular to the first horizontal direction.

According to some embodiments, a wordline trench 112 extending in the first horizontal direction (the X direction) may be formed in the substrate 102, and a gate dielectric layer 114, a wordline 116, and a first capping insulating layer 118 may be arranged in the wordline trench 112. The wordline 116 of FIG. 1C may correspond to a wordline WL of FIG. 1A.

According to some embodiments, the gate dielectric layer 114 may include at least one selected from a silicon oxide layer, a silicon nitride layer, a silicon oxynitride layer, an oxide/nitride/oxide (ONO) layer, and/or a high dielectric (e.g., high-k) layer having a higher dielectric constant than the silicon oxide layer. The high dielectric layer may include $HfO_2$, $Al_2O_3$, $HfAlO_3$, $Ta_2O_3$, $TiO_2$, or a combination thereof. The wordline 116 may include Ti, TiN, Ta, TaN, W, WN, TiSiN, WSiN, or a combination thereof. The first capping insulating layer 118 may include a silicon oxide layer, a silicon nitride layer, a silicon oxynitride layer, or a combination thereof.

According to some embodiments, the wordline WL may be arranged to cross or intersect the active regions ACT. According to some embodiments, the first active region 106*a* may be arranged between a pair of wordlines WL crossing the active region ACT, and the second active region 106*b* may be arranged at an edge of the active region ACT.

According to some embodiments, a first buffer layer 122 and a first conductive layer 124 may be sequentially disposed on the substrate 102. According to some embodiments, the first buffer layer 122 may cover an upper surface of the active region ACT and an upper surface of the device isolation layer 104.

According to some embodiments, the first buffer layer 122 may include a first silicon oxide layer, a silicon nitride layer, and a second silicon oxide layer sequentially formed on the substrate 102, but is not limited thereto. According to some embodiments, the first conductive layer 124 may include a doped polysilicon layer.

According to some embodiments, a direct contact opening 184 exposing the first active region 106*a* may be formed. According to some embodiments, the direct contact opening 184 may pass or extend through the first buffer layer 122 and the first conductive layer 124, and may pass or extend through portions of the plurality of active regions ACT and the device isolation layer 104.

According to some embodiments, the direct contact opening 184 may be defined by a plurality of cell patterns CP. According to some embodiments, the plurality of cell patterns CP may have a pillar shape vertically protruding or extending from a lower surface 184L of the direct contact opening 184 on the second active region 106*b*.

According to some embodiments, the plurality of cell patterns CP may include the second active region 106*b* therein. For example, the plurality of cell patterns CP may include together the second active regions 106*b* of each of two adjacent active regions ACT from among the plurality of active regions ACT. For example, the plurality of cell patterns CP may overlap the second active regions 106*b* of each of two adjacent active regions ACT from among the plurality of active regions ACT.

According to some embodiments, the direct contact opening 184 may be a space between the plurality of cell patterns CP, and may be a space recessed in a vertical direction (a Z direction). According to some embodiments, from a horizontal point of view or plan point of view, the direct contact opening 184 may be defined by side surfaces CPW of the plurality of cell patterns CP.

According to some embodiments, from a horizontal point of view or plan point of view, the plurality of cell patterns CP may have a separate island shape. FIG. 1 illustrates that, from a plan point of view, the plurality of cell patterns CP have an elliptical shape or an elliptical shape having a deformed portion, but the plurality of cell patterns CP are not limited thereto. For example, the plurality of cell patterns CP may have a shape, such as a rectangle or a circle, from a plan point of view.

According to some embodiments, the side surfaces CPW of the plurality of cell patterns CP may include side surfaces of the first conductive layer 124, the first buffer layer 122, the device isolation layer 104, and the first capping insulating layer 118 through which the direct contact opening 184 passes or extends.

A plurality of buried contacts BC and a plurality of bitline spacers 216, which will be described later, may pass or extend through portions of the plurality of cell patterns CP in the vertical direction (the Z direction). Boundaries of the plurality of cell patterns CP illustrated in FIG. 1 may indicate boundaries of the side surfaces CPW of unpenetrated portions of the plurality of cell patterns CP.

According to some embodiments, the plurality of cell patterns CP may include a plurality of first cell groups CPG1 and a plurality of second cell groups CPG2. The plurality of first cell groups CGP1 are arranged along the first horizontal direction (the X direction) and extend in the second horizontal direction (the Y direction). Each of the plurality of first cell groups include a plurality of first cell patterns CP1 arranged in a row along the second horizontal direction (the Y direction). The plurality of second cell groups CGP2 are spaced apart from the plurality of the first cell groups CPG1, arranged along the first horizontal direction (X direction), and extend in the second horizontal direction (the Y direction). Each of the plurality of second cell groups include a plurality of second cell patterns CP2 arranged in a row along the second horizontal direction (the Y direction). According to some embodiments, the first cell groups CPG1 and the second cell groups CPG2 may be spaced apart from each other in a first direction (the X direction) and a second direction (the Y direction). The plurality of the first cell patterns CP1 and the plurality of the second cell patterns CP2 are spaced apart from each other in the first direction (the X direction) and the second direction (the Y direction).

According to some embodiments, a plurality of first cell groups CPG1 and a plurality of second cell groups CPG2 may cross or intersect each other. For example, the plurality of first cell patterns CP1 and the plurality of second cell patterns CP2 may not be arranged on a straight line in the first direction (the X direction). For example, the plurality of first cell patterns CP1 and the plurality of second cell patterns CP2 may not be arranged on a straight line in the second direction (the Y direction). For example, the plurality of first cell patterns CP1 and the plurality of second cell patterns CP2 may be offset from each other.

According to some embodiments, from a plan point of view, the plurality of first cell patterns CP1 and the plurality of second cell patterns CP2 may be arranged to surround each other. For example, one first cell pattern CP1 may be surrounded by a plurality of second cell patterns CP2. For example, one second cell pattern CP2 may be surrounded by a plurality of first cell patterns CP1.

According to some embodiments, a first cell matrix CPM1 in which a plurality of first cell groups CPG1 are arranged in the first horizontal direction (the X direction) may be defined. According to some embodiments, a plurality of first cell patterns CP1 of a first cell group CPG1 may be arranged with a plurality of first cell patterns CP1 of another adjacent first cell group CPG1 on a straight line in the first horizontal direction (the X direction).

According to some embodiments, a second cell matrix CPM2 in which a plurality of second cell groups CPG2 are arranged in the first horizontal direction (the X direction) may be defined. According to some embodiments, a plurality of second cell patterns CP2 of a second cell group CPG2 may be arranged with a plurality of second cell patterns CP2 of another adjacent second cell group CPG2 on a straight line in the first horizontal direction (the X direction).

According to some embodiments, each of the first cell matrix CPM1 and the second cell matrix CPM2 may have a rectangular arrangement structure. According to some embodiments, each of the first cell matrix CPM1 and the second cell matrix CPM2 may have a parallelogram arrangement structure.

According to some embodiments, a plurality of first cell patterns CP1 may be arranged to be spaced apart from each other by a first cell distance a1 in the second horizontal direction (the Y direction), and may be arranged to be spaced apart from each other by a second cell distance a2 in the first horizontal direction (the X direction). According to some embodiments, a plurality of second cell patterns CP2 may be arranged to be spaced apart from each other by a third cell distance b1 in the second horizontal direction (the Y direction), and may be arranged to be spaced apart from each other by a fourth cell distance b2 in the first horizontal direction (the X direction). According to some embodiments, the first cell distance a1 and the third cell distance b1 may be substantially the same as each other, and the second cell distance a2 and the fourth cell distance b2 may be substantially the same as each other. Here, each of the first cell distance a1, the second cell distance a2, the third cell distance b1, and the fourth cell distance b2 may refer to a distance between centers of a plurality of cell patterns CP. A magnitude relationship of comparing the first cell distance a1, the second cell distance a2, the third cell distance b1, and the fourth cell distance b2 may be substantially the same as a magnitude relationship according to a distance between the side surfaces CPW of each of the plurality of cell patterns CP.

According to some embodiments, the first cell distance a1 and the second cell distance a2 may be the same as each other, and the third cell distance b1 and the fourth cell distance b2 may be the same as each other. In this case, each of the first cell matrix CPM1 and the second cell matrix CPM2 may have a square arrangement structure. According to some embodiments, each of the first cell matrix CPM1 and the second cell matrix CPM2 may also have a rhombus arrangement structure.

According to some embodiments, from a horizontal point of view or plan point of view, one second cell pattern CP2 may be arranged within a rectangular arrangement R1 of the first cell matrix CPM1, and one first cell pattern CP1 may be arranged within a rectangular arrangement R2 of the second cell matrix CPM2.

According to some embodiments, a virtual third cell pattern CPS, which is arranged at a center of each of the rectangular arrangements R1 and R2 of the first and second cell matrices CPM1 and CPM2, may be defined. For example, a center CPSC of the third cell pattern CPS may be a center of a rectangle formed by connecting centers CC1 of four first cell patterns CP1 surrounding the third cell pattern CPS.

According to some embodiments, a center CC2 of the second cell pattern CP2 may not match the center CPSC of the third cell pattern CPS. For example, the first cell pattern CP1 may not be arranged at the center of the rectangular arrangement R2 of the second cell matrix CPM2. For example, the first cell pattern CP1 may be offset from the center of the rectangular arrangement R2. For example, the second cell pattern CP2 may not be arranged at the center of the rectangular arrangement R1 of the first cell matrix CPM1. For example, from a horizontal point of view or plan point of view, the center CC2 of the second cell pattern CP2 may be arranged at a location moved from the center CPSC of the third cell pattern CPS in the second horizontal direction (the Y direction) and/or the first horizontal direction (the X direction). For example, the center CC2 of the second cell pattern CP2 may be offset from the center of the rectangular arrangement R1 (e.g., offset from the center CPSC of the third cell pattern CPS).

According to some embodiments, at least two first cell patterns CP1 from among a plurality of first cell patterns CP1 surrounding the second cell pattern CP2 may have different distances from the second cell pattern CP2. For example, distances DAB1 and DAB2 from the center CC2 of the second cell pattern CP2 to the centers CC1 of the plurality of first cell patterns CP1 may not be the same as each other.

According to some embodiments, from a horizontal point of view or plan point of view, a plurality of second cell patterns CP2 surrounding a first cell pattern CP1 may be asymmetrically arranged with respect to the first cell pattern CP1. According to some embodiments, from a horizontal point of view or plan point of view, first cell patterns CP1 surrounding a second cell pattern CP2 may be asymmetrically arranged with respect to the second cell pattern CP2.

According to some embodiments, from a horizontal point of view or plan point of view, a shape of a cross section of a first cell pattern CP1 may be different from a shape of a cross section of the second cell pattern CP2. According to some embodiments, a horizontal area (e.g., planar area) of the second cell pattern CP2 may be less than a horizontal area (e.g., planar area) of the first cell pattern CP1. According to some embodiments, from a horizontal point of view or plan point of view, a cross section of a second cell pattern CP2 may be spaced apart from a first cell pattern CP1 adjacent thereto by a first separation distance t1, and may have a shape cut along a boundary of the first cell pattern CP1 adjacent thereto.

According to some embodiments, a side surface CPW of a second cell pattern CP2 may have a concave portion CA that is concavely recessed inward along a side surface CPW of a first cell pattern CP1 adjacent to the second cell pattern CP2. In this case, the second cell pattern CP2 may be arranged such that the concave portion CA is spaced apart from the first cell pattern CP1 by the first separation distance t1.

According to some embodiments, the first separation distance t1 may refer to a least separation distance between the first cell pattern CP1 and the second cell pattern CP2. According to some embodiments, a plurality of first cell patterns CP1 and a plurality of second cell patterns CP2 may be spaced apart from each other at an interval or distance greater than or equal to the first separation distance t1. Accordingly, a least distance of spacing between a plurality of cell patterns CP may be secured, and the electrical reliability of an integrated circuit device may be improved.

Figure 1E:
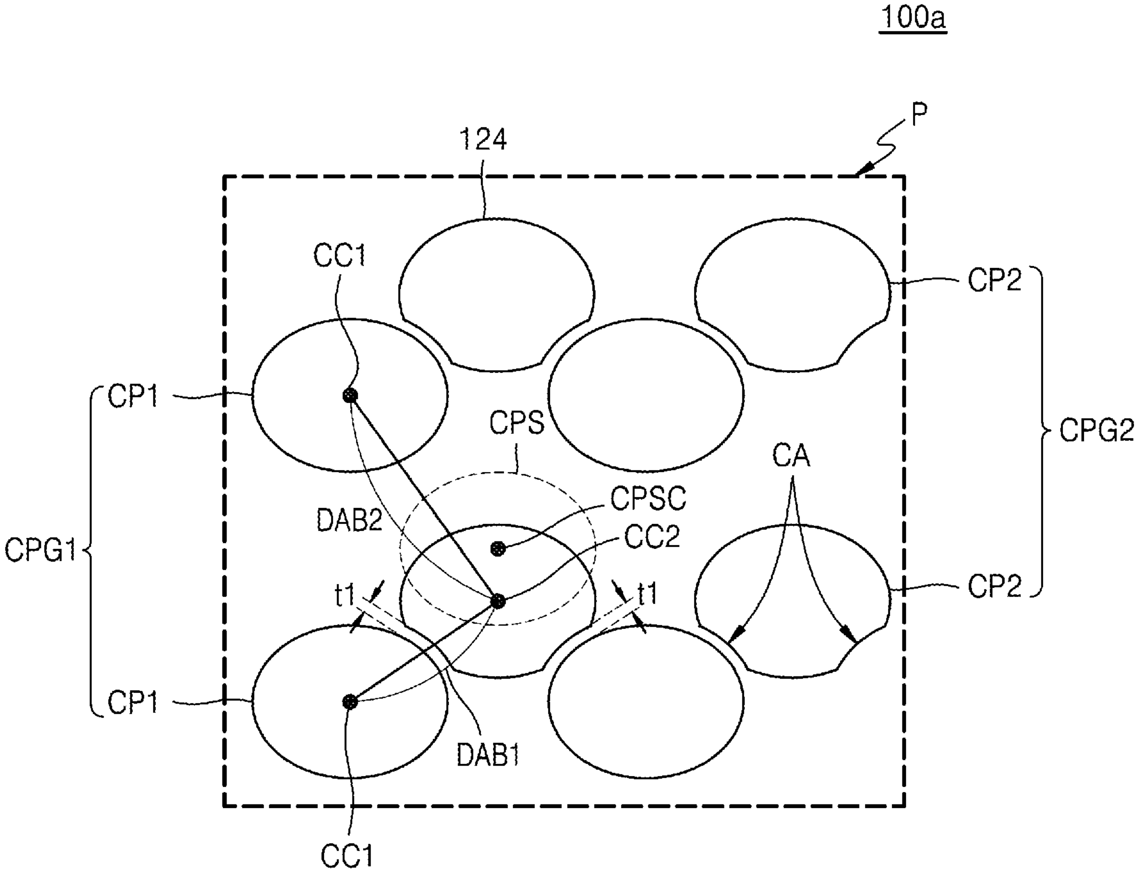
FIG. 1E is an enlarged view of a portion of a layout diagram of an integrated circuit device according to some example embodiments, i.e., an enlarged view illustrating a region corresponding to a region indicated by P of FIG. 1A.

FIG. 1E is an enlarged view of a portion of a layout diagram of an integrated circuit device 100*a* according to some example embodiments, i.e., an enlarged view illustrating a region corresponding to a region indicated by P of FIG. 1A;

Referring to FIG. 1E, a second cell pattern CP2 may have a plurality of concave portions CA. For example, the second cell pattern CP2 may be arranged to be spaced apart from two first cell patterns CP1 adjacent thereto by a first separation distance t1, and may have two concave portions CA.

Referring back to FIGS. 1A, 1B, 1C, and 1D, a plurality of bitlines BL may extend parallel to each other in the second horizontal direction (the Y direction) on a plurality of wordlines WL. According to some embodiments, portions of the plurality of wordlines WL may overlap a plurality of cell patterns CP in the vertical direction (the Z direction).

According to some embodiments, the plurality of bitlines BL may be disposed on the first buffer layer 122. According to some embodiments, the plurality of bitlines BL may include the first conductive layers 124 and second conductive layers 204 on the first conductive layers 124. Although FIG. 1B illustrates that a bitline BL has two conductive layers, the bitline BL may include a plurality of conductive layers including three or more layers. Each of a plurality of bitlines BL may be covered by a second capping insulating layer 206.

According to some embodiments, the second conductive layer 204 may include a layer including Ti, TiN, TiSiN, tungsten (W), WN, tungsten silicide ($WSi_x$), tungsten silicon nitride ($WSi_xN_y$), ruthenium (Ru), or a combination thereof. According to some embodiments, the second capping insulating layer 206 may include a silicon nitride layer.

According to some embodiments, the plurality of bitlines BL may be connected to a plurality of active regions ACT through a direct contact DC. According to some embodiments, the direct contact DC may be connected to a first active region 106*a* exposed through the direct contact opening 184. According to some embodiments, the direct contact DC may include Si, Ge, W, WN, Co, Ni, Al, Mo, Ru, Ti, TiN, Ta, TaN, Cu, or a combination thereof. In some embodiments, the direct contact DC may include a doped polysilicon layer.

According to some embodiments, the direct contact DC may face side surfaces CPW of a plurality of cell patterns CP in the first direction (the X direction). According to some embodiments, the direct contact DC may face the side surfaces CPW of the plurality of cell patterns CP with an insulating spacer 214 arranged therebetween in the second direction (the Y direction). According to some embodiments, the direct contact DC may be surrounded by cell patterns CP with the insulating spacer 214 arranged therebetween. According to some embodiments, at least two of a plurality of cell patterns CP surrounding the direct contact DC may have different distances from the direct contact DC. For example, horizontal thicknesses of the insulating spacer 214 between a plurality of cell patterns CP surrounding the direct contact DC and the direct contact DC may be different from each other.

According to some embodiments, the insulating spacer 214 may fill a space defined by a plurality of cell patterns CP and the direct contact DC. According to some embodiments, the insulating spacer 214 may be formed as at least one single layer or multilayers selected from a group including a silicon oxide layer, a silicon nitride layer, and/or a silicon oxynitride layer.

According to some embodiments, a plurality of buried contacts BC may be formed between two adjacent bitlines BL from among a plurality of bitlines BL. According to some embodiments, a plurality of bitline spacers 216 may be arranged between the plurality of bitlines BL and the plurality of buried contacts BC, respectively. According to some embodiments, sidewalls of the plurality of bitlines BL may face the plurality of buried contacts BC with the plurality of bitline spacers 216 arranged therebetween, respectively.

According to some embodiments, the plurality of buried contacts BC may be arranged in a line in the second horizontal direction (the Y direction) and the first horizontal direction (the X direction). A plurality of conductive landing pads 222 may be formed on the plurality of buried contacts BC. The plurality of bitline spacers 216 may also be arranged between the plurality of conductive landing pads 222 and a plurality of second capping insulating layers 206, respectively.

According to some embodiments, the plurality of buried contacts BC and the plurality of conductive landing pads 222 may be configured to connect lower electrodes (not shown) of capacitors 232 formed above or on the plurality of bitlines BL to the active regions ACT. According to some embodiments, the plurality of conductive landing pads 222 may be connected to a plurality of capacitors 232 via a plurality of via plugs 228. According to some embodiments, at least a portion of each of the plurality of conductive landing pads 222 may vertically overlap the buried contact BC.

According to some embodiments, a landing pad isolation pattern 224 may be arranged between the plurality of conductive landing pads 222. According to some embodiments, the plurality of conductive landing pads 222 may be isolated from each other by the landing pad isolation pattern 224.

According to some embodiments, the bitline spacers 216 may include at least one material selected from silicon nitride, silicon oxide, and/or silicon nitride oxide. According to some embodiments, the landing pad isolation pattern 224 may include at least one material selected from silicon nitride, silicon oxide, and/or silicon nitride oxide.

FIGS. 2A, 2B, 3A, 3B, 4A, 4B, 5A, 5B, 6A, 6B, 7A, 7B, 8A, 8B, 9, 10A, and 10B are plan views and cross-sectional views illustrating a process sequence of a method of manufacturing the integrated circuit device 100, according to some example embodiments. In detail, FIGS. 2A, 3A, 4A, 5A, 6A, 7A, 8A, and 10A are plan views illustrating a method of manufacturing a cell pattern CP of the integrated circuit device 100, according to some example embodiments, and FIGS. 2B, 3B, 4B, 5B, 6B, 7B, 8B, 9, and 10B are cross-sectional views taken along lines A-A', B-B', and C-C' of FIGS. 2A, 3A, 4A, 5A, 6A, 7A, 8A, and 10A, respectively.

Figure 2A:
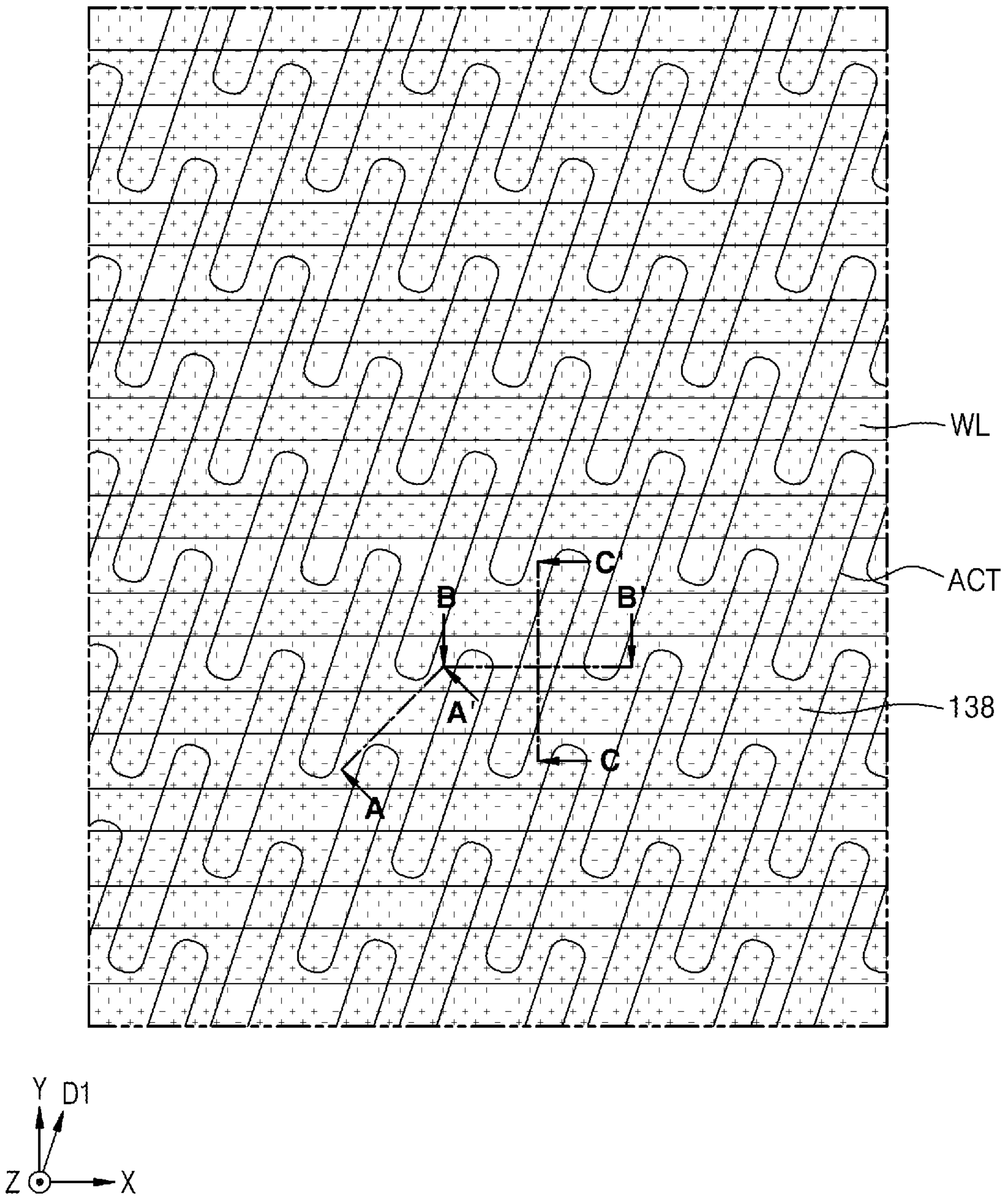
FIGS. 2A, 2B, 3A, 3B, 4A, 4B, 5A, 5B, 6A, 6B, 7A, 7B, 8A, 8B, 9, 10A, and 10B are plan views and cross-sectional views illustrating a process sequence of a method of manufacturing an integrated circuit device, according to some example embodiments, in detail.
Figure 2B:
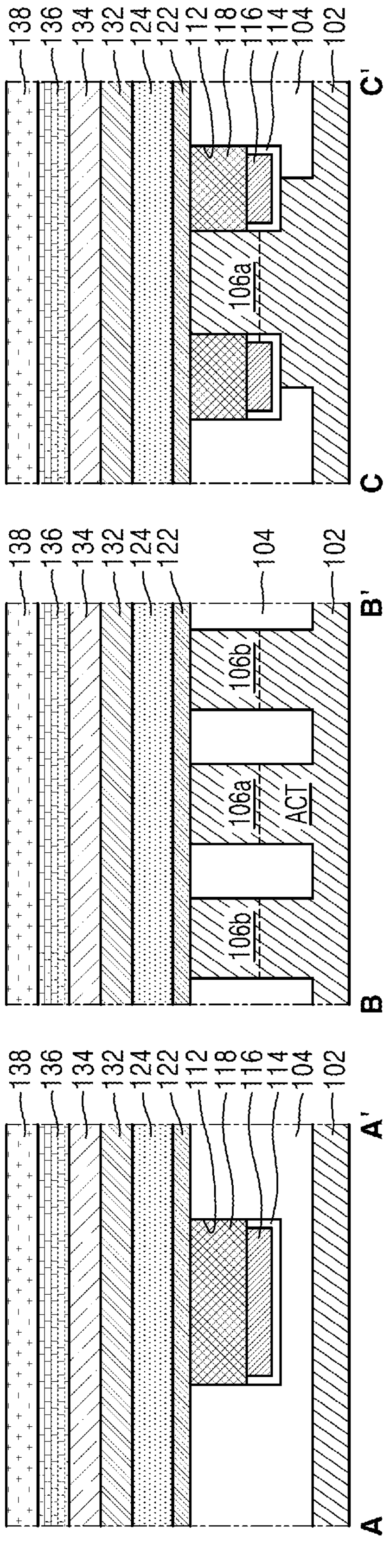

Referring to FIGS. 2A and 2B, a first buffer layer 122 may be formed on a substrate 102. The first buffer layer 122 may cover an upper surface of an active region ACT and an upper surface of a device isolation layer 104.

According to some embodiments, a first conductive layer 124, a second buffer layer 132, an interlayer insulating layer 134, a first mask layer 136, and a second mask layer 138 may be sequentially formed (e.g., stacked) on the first buffer layer 122.

According to some embodiments, the second buffer layer 132 may include amorphous carbon. The second buffer layer 132 may include a single layer or a multilayer. For example, the second buffer layer 132 may include a layer including at least one material selected from silicon nitride, silicon oxide, and/or silicon nitride oxide. For example, the second buffer layer 132 may be a double layer in which an amorphous carbon layer and silicon nitride oxide are sequentially stacked.

According to some embodiments, the interlayer insulating layer 134 may include at least one material selected from silicon nitride, silicon oxide, and/or silicon nitride oxide. For example, the interlayer insulating layer 134 may be a single layer or a multilayer including at least one material selected from silicon nitride, silicon oxide, and/or silicon nitride oxide.

According to some embodiments, the first mask layer 136 may be a double layer in which a spin-on hard mask and at least one material selected from silicon nitride, silicon oxide, and/or silicon nitride oxide are stacked. According to some embodiments, the second mask layer 138 may be a double layer in which a spin-on hard mask and at least one material selected from silicon nitride, silicon oxide, and/or silicon nitride oxide are stacked.

According to some embodiments, the interlayer insulating layer 134 may include silicon oxide, the first mask layer 136 may be a double layer in which a spin-on hard mask and silicon nitride oxide are sequentially stacked, and the second mask layer 138 may be a double layer in which a spin-on hard mask and a silicon nitride oxide are sequentially stacked.

Figure 3A:
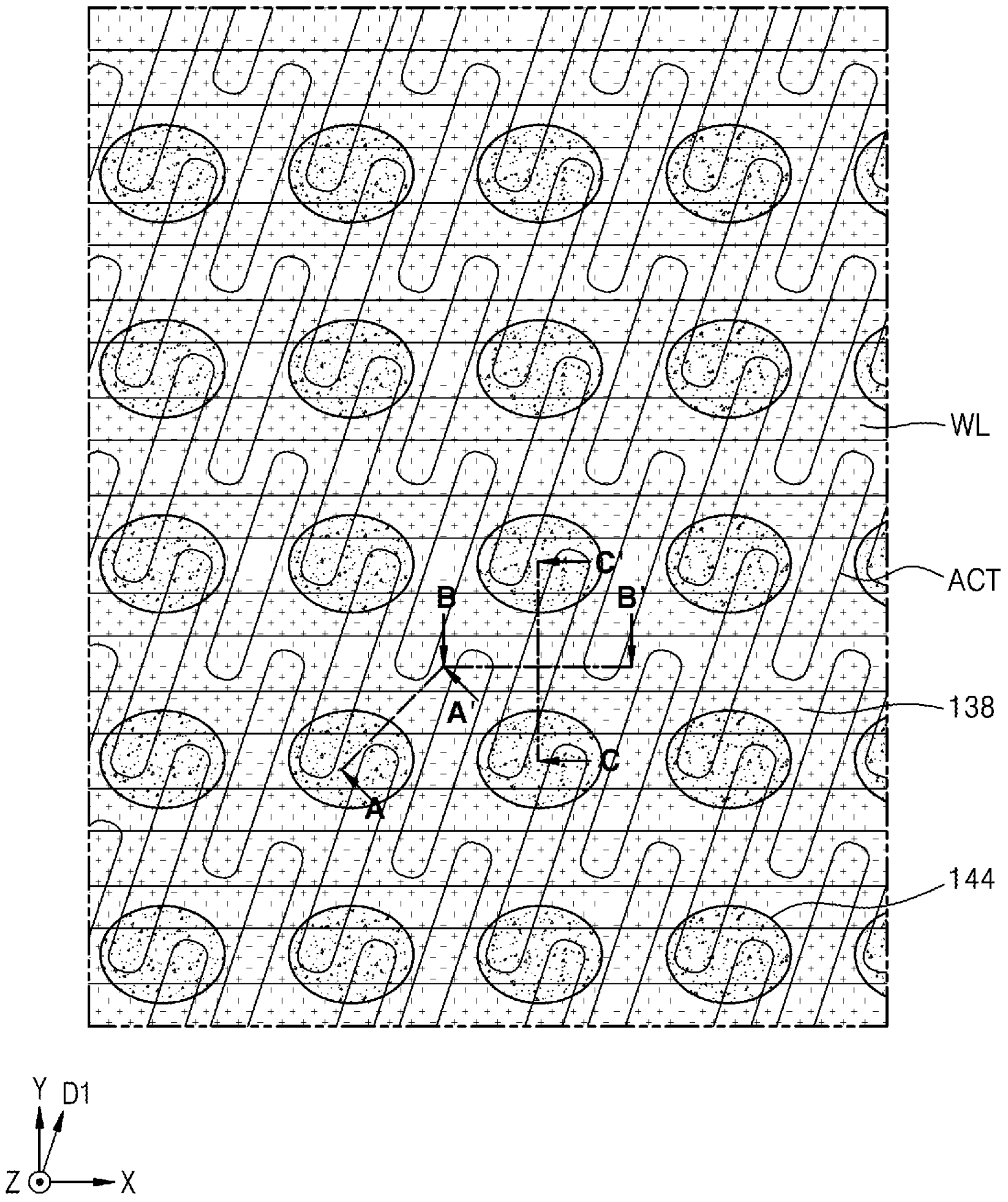
Figure 3B:
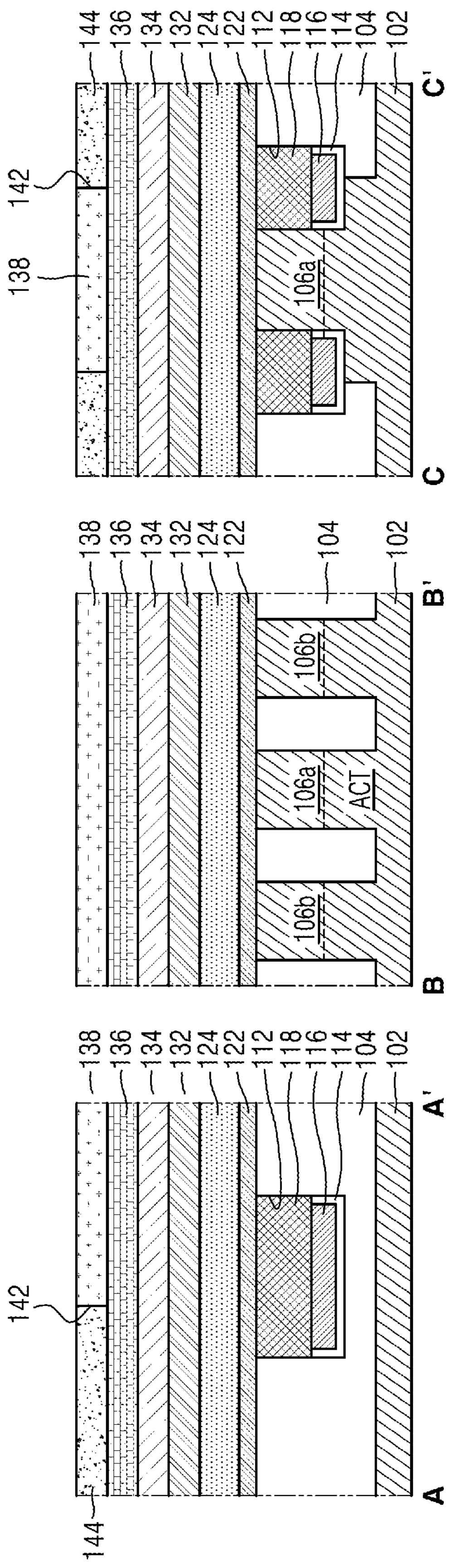

Referring to FIGS. 3A and 3B, a first pattern opening 142 may be formed by disposing a first cell pattern mask (not shown) on the second mask layer 138 and removing a portion of the second mask layer 138. According to some embodiments, the first pattern opening 142 may be formed above or on a second active region **106*b*. For example, the first pattern opening 142 may vertically overlap a second active region 106*b* located at one end of one of two adjacent active regions ACT and a second active region 106*b*** located at one end of the other one of two adjacent active regions ACT.

Subsequently, a first pattern insulating layer 144 may be filled in the first pattern opening 142. According to some embodiments, the first pattern insulating layer 144 may include silicon oxide. For example, the first pattern insulating layer 144 may cover together two adjacent second active regions **106*b*** located at ends of some of a plurality of active regions ACT.

Figure 4A:
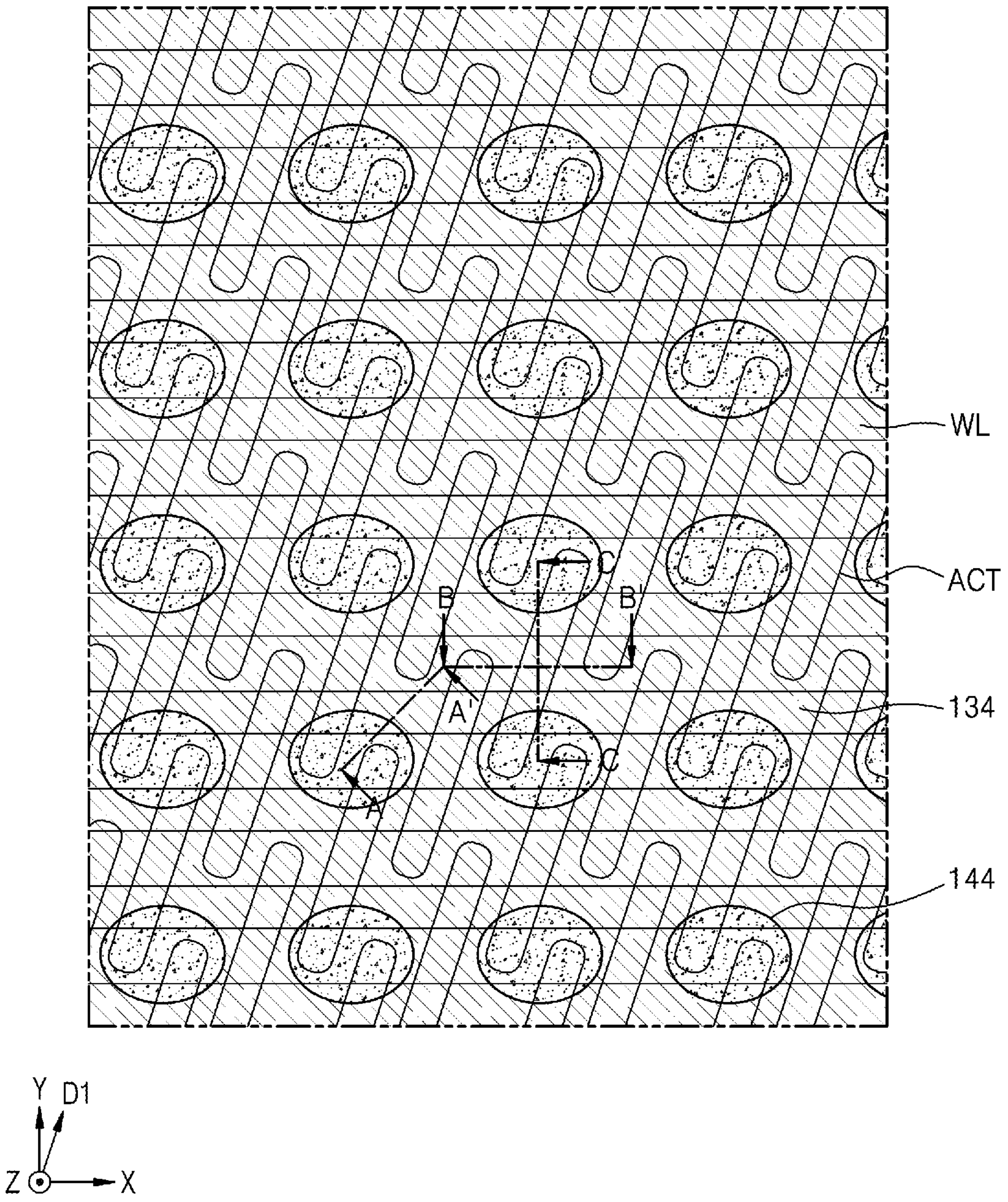
Figure 4B:
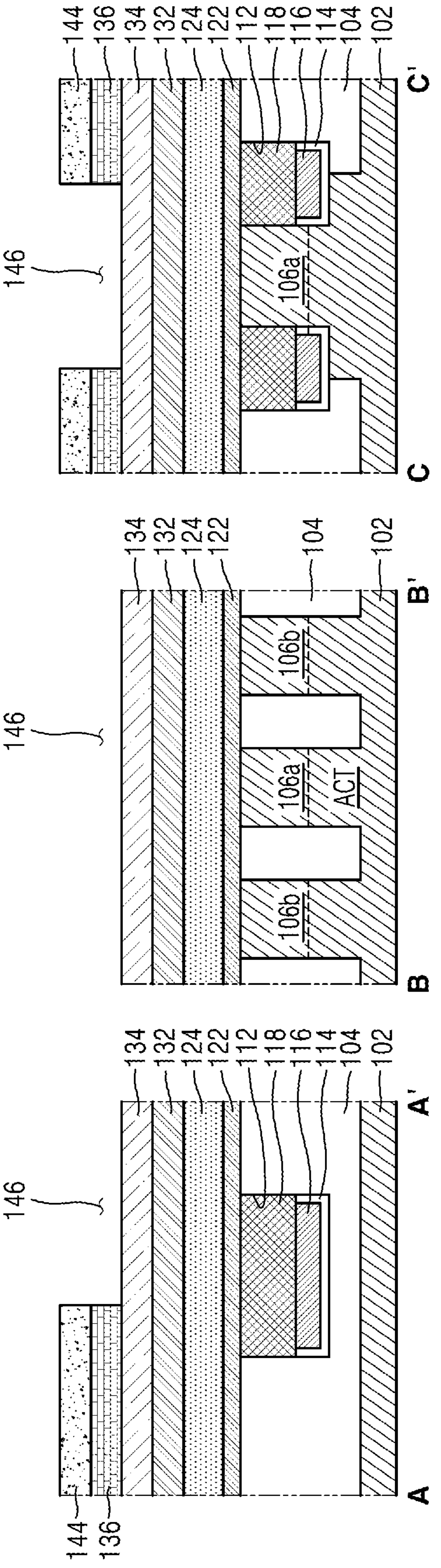

Referring to FIGS. 4A and 4B, a portion of the second mask layer 138 may be removed by using the first pattern insulating layer 144 as an etching mask, and thus a second mask opening 146 may be formed. In this case, a portion of an upper surface of the interlayer insulating layer 134 may be exposed.

Figure 5A:
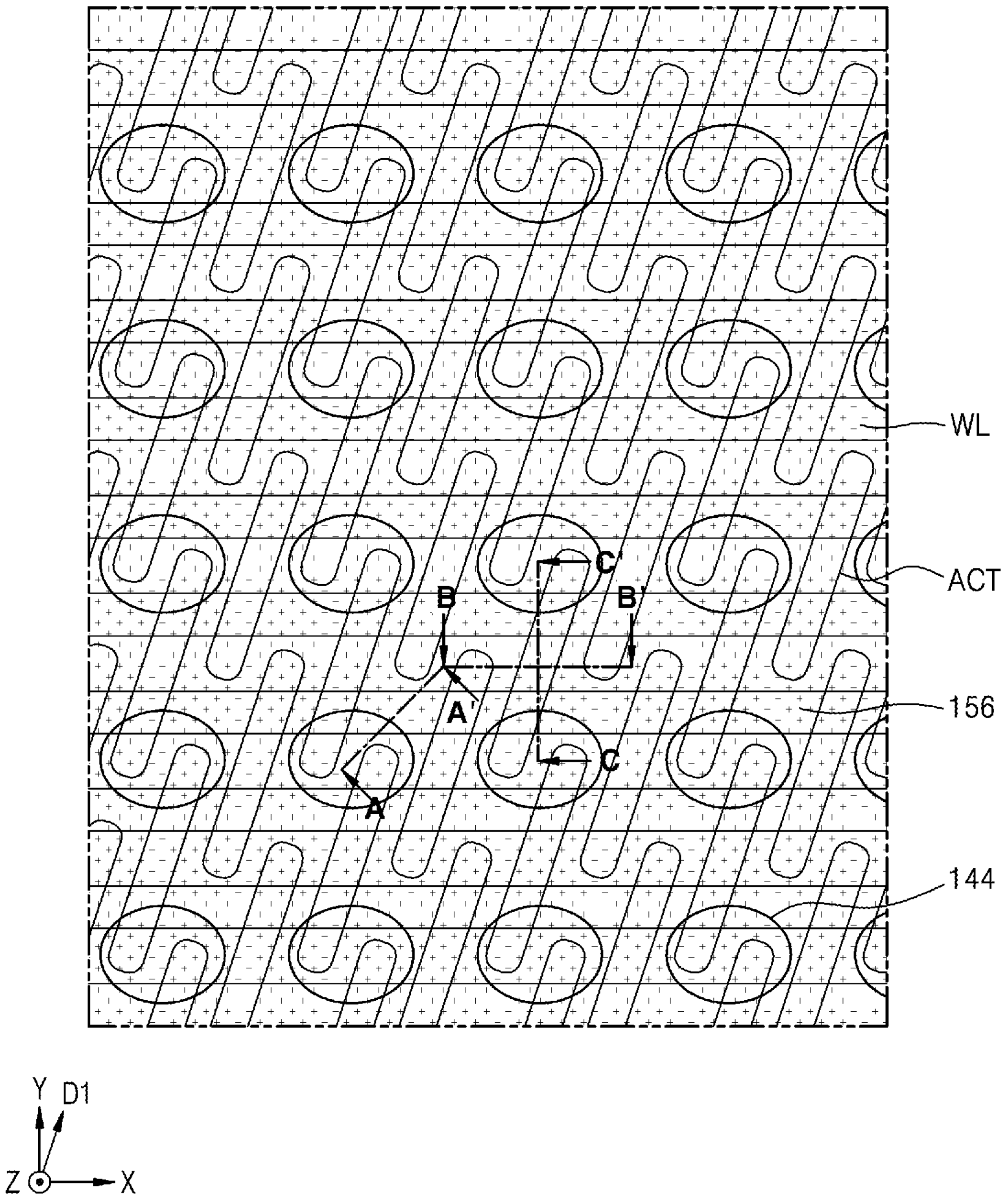
Figure 5B:
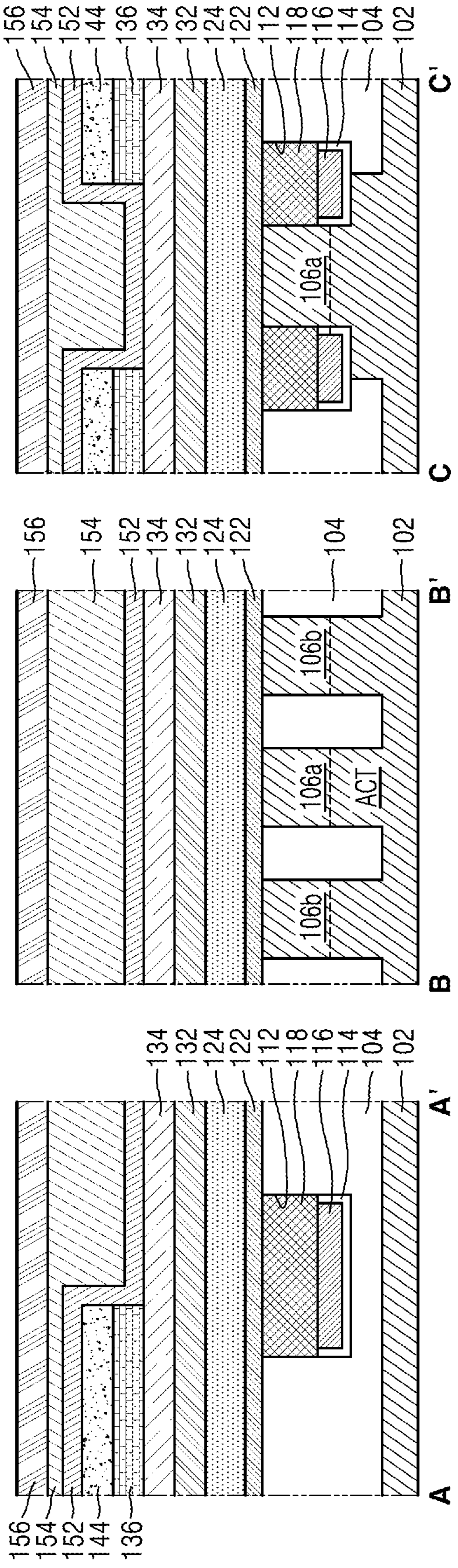

Referring to FIGS. 5A and 5B, a cell isolation layer 152 may be conformally coated on the first pattern insulating layer 144 and the interlayer insulating layer 134. For example, the cell isolation layer 152 may have a thickness of the first separation distance t1 (shown in FIG. 6B), and may cover an upper surface of the first pattern insulating layer 144, a side surface of the first pattern insulating layer 144, a side surface of the first mask layer 136, and an upper surface of the interlayer insulating layer 134. According to some embodiments, the cell isolation layer 152 may include silicon oxide.

Subsequently, a third mask layer 154 and a fourth mask layer 156 may be sequentially formed on the cell isolation layer 152. According to some embodiments, the third mask layer 154 may include a double layer. For example, the third mask layer 154 may be a double layer in which a spin-on hard mask and silicon nitride oxide are sequentially stacked. In this case, an upper surface of a layer including a spin-on hard mask may be formed at a level vertically higher than an upper surface of the cell isolation layer 152 covering the first pattern insulating layer 144. For example, a layer including silicon nitride oxide may be formed on an upper surface of a spin-on hard mask. According to some embodiments, the fourth mask layer 156 may include a spin-on hard mask.

Figure 6A:
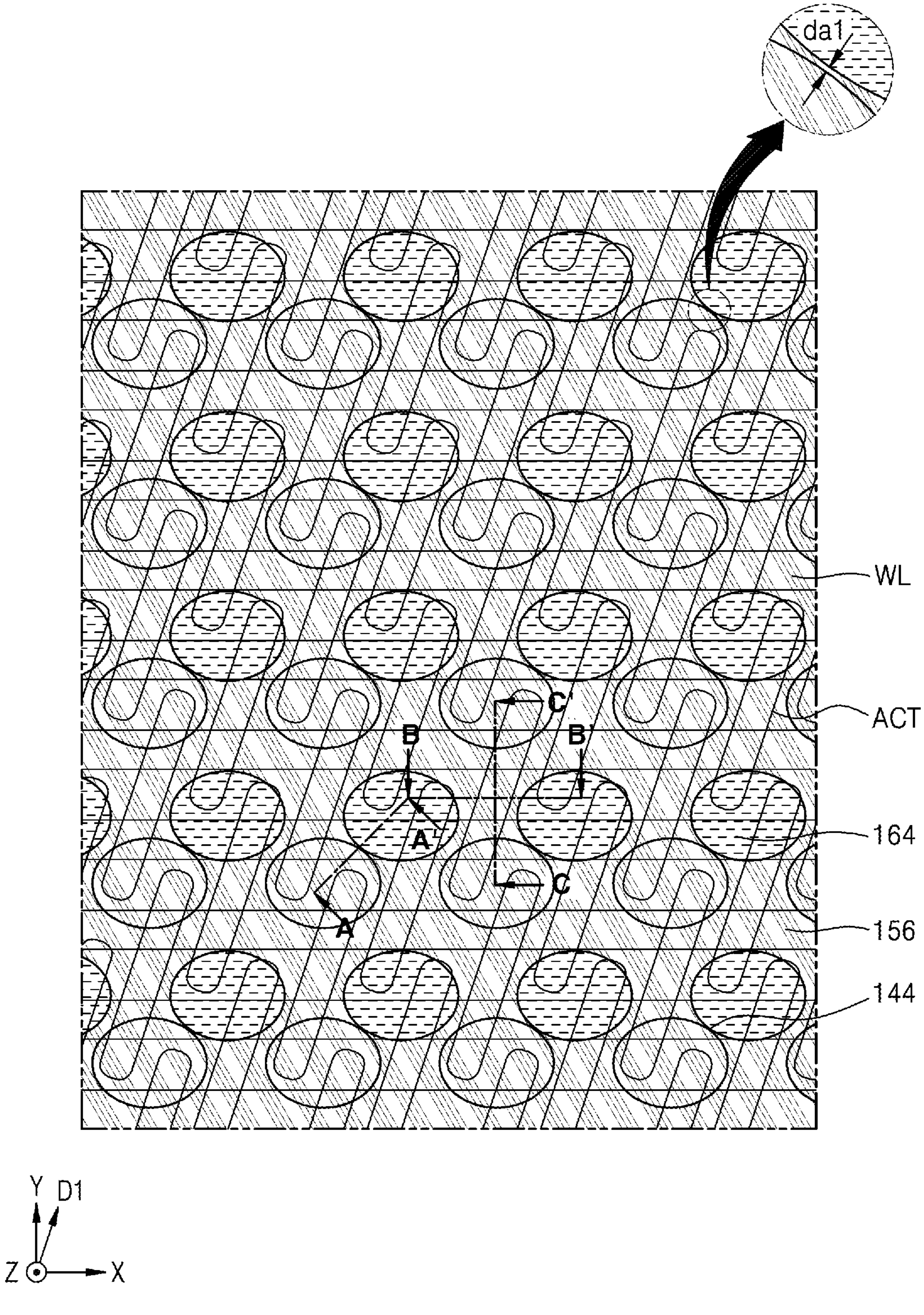
Figure 6B:
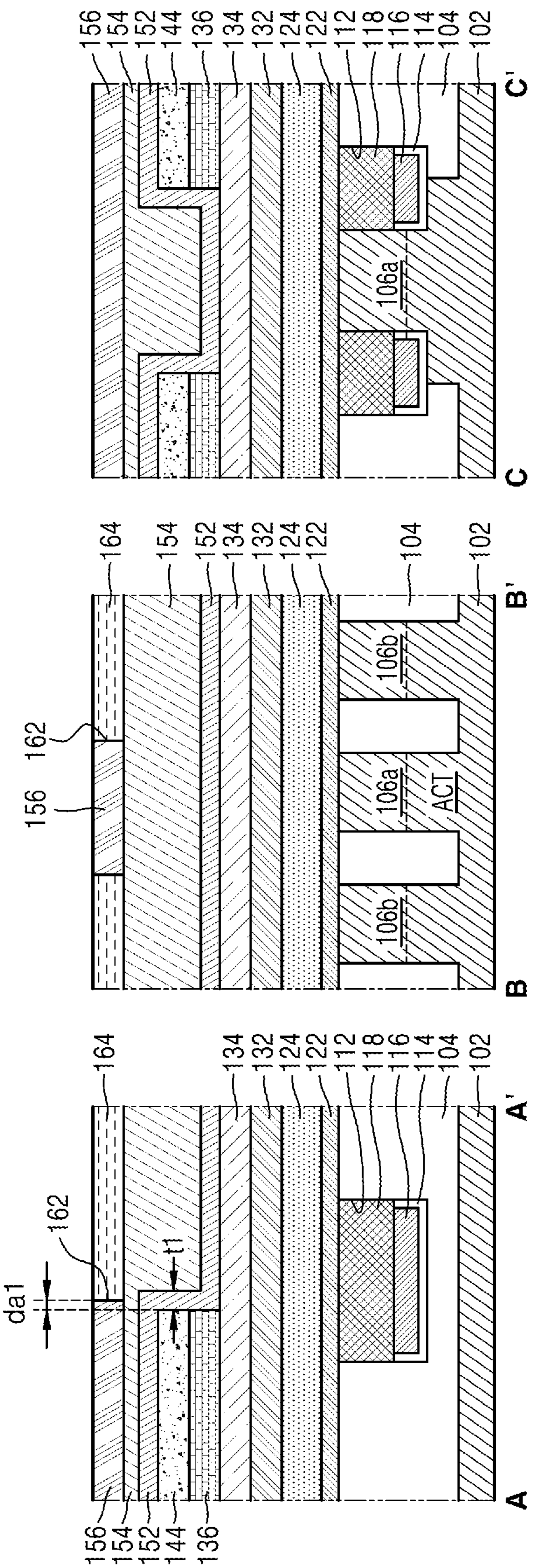
Figure 7A:
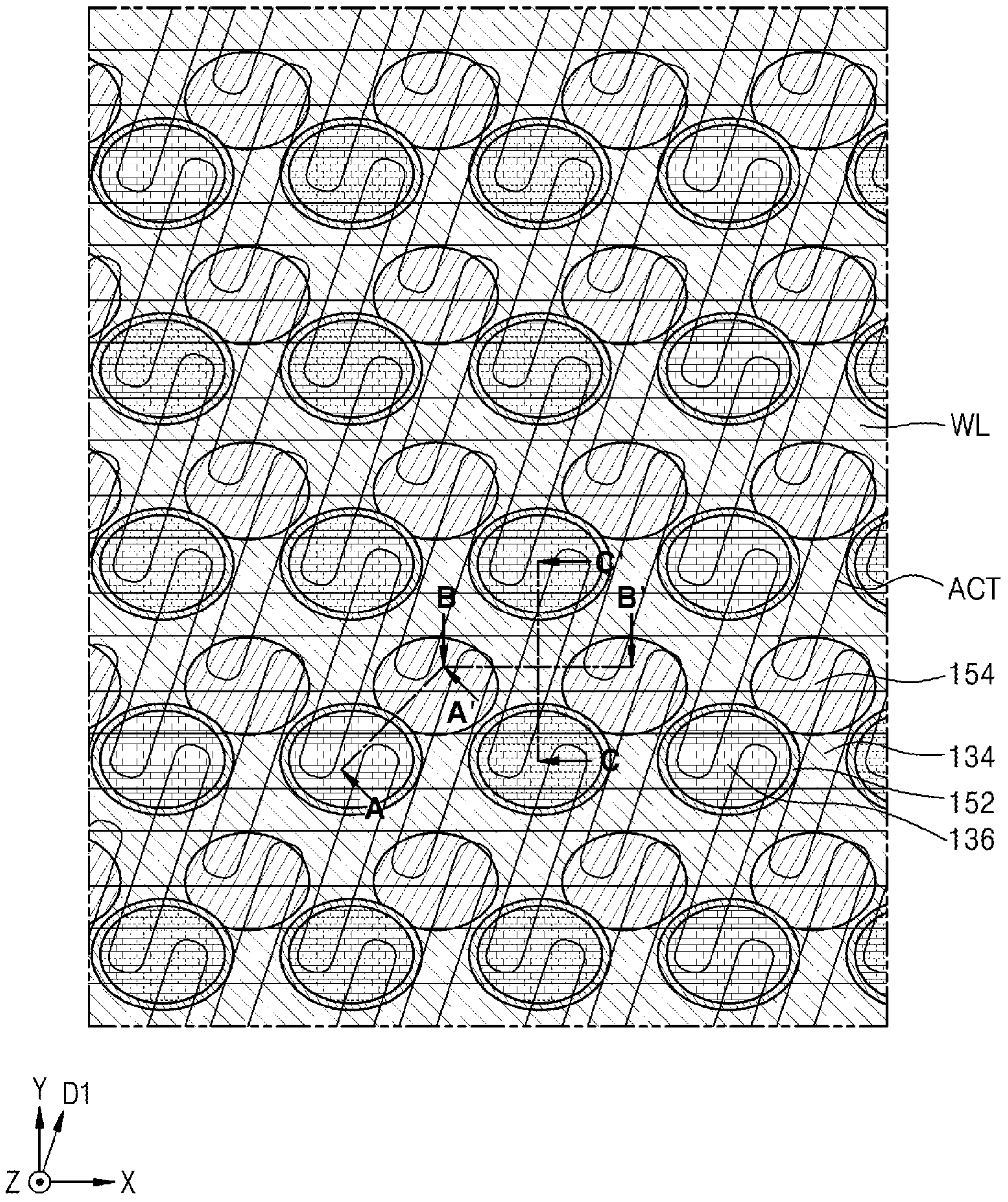
Figure 7B:
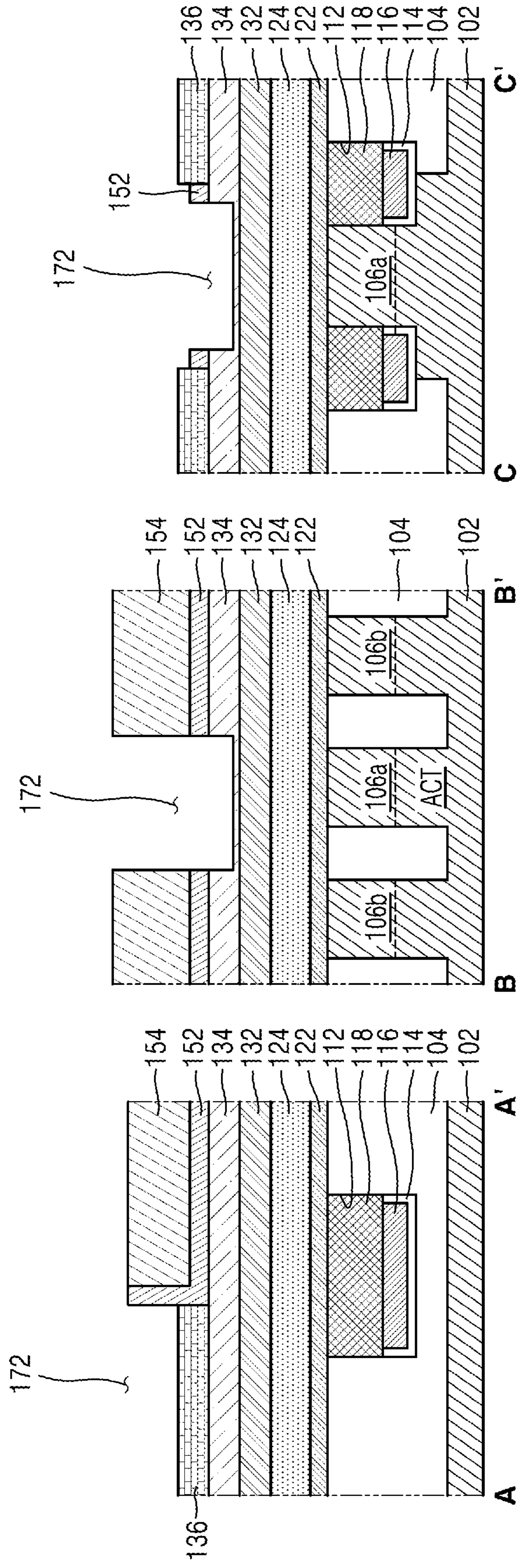

Referring to FIGS. 6A and 6B, a second pattern opening 162 may be formed by disposing a second cell pattern mask (not shown) on the fourth mask layer 156 and removing a portion of the fourth mask layer 156. Subsequently, a second pattern insulating layer 164 may be filled in the second pattern opening 162. According to some embodiments, the second pattern insulating layer 164 may include silicon oxide.

According to some embodiments, the second pattern opening 162 may be formed above or on a plurality of second active regions 106*b* that are not covered by the first pattern insulating layer 144. According to some embodiments, the second pattern insulating layer 164 may cover two adjacent second active regions 106*b*, which are not covered by the first pattern insulating layer 144, from among a plurality of second active regions 106*b*.

According to some embodiments, when the first pattern insulating layer 144 and the second pattern insulating layer 164 are projected on the same plane, a pattern insulating layer distance da1, which is a distance between the first pattern insulating layer 144 and the second pattern insulating layer 164, may be less than the first separation distance t1. Although FIG. 6B illustrates that the first pattern insulating layer 144 and the second pattern insulating layer 164 do not vertically overlap each other, the first pattern insulating layer 144 and the second pattern insulating layer 164 may also vertically overlap each other.

Referring to FIGS. 6A, 6B, 7A, and 7B together, the first pattern insulating layer 144 and the second pattern insulating layer 164 may be removed via an etching process. In this case, at least portions of the fourth mask layer 156, the third mask layer 154, the cell isolation layer 152, the first mask layer 136, and the interlayer insulating layer 134 may be removed together, and a second mask opening 172 may be formed. Accordingly, the first mask layer 136, the third mask layer 154, the interlayer insulating layer 134, and the cell isolation layer 152 may be exposed.

According to some embodiments, from a plan point of view, the cell isolation layer 152 extending in a vertical direction (a Z direction) may be arranged to surround the first mask layer 136 with a certain thickness (e.g., the first separation distance t1). According to some embodiments, the third mask layer 154 may be spaced apart from the first mask layer 136 with the cell isolation layer 152 arranged therebetween. For example, the first mask layer 136 and the third mask layer 154 may be spaced apart from each other by the first separation distance t1 that is a thickness of the cell isolation layer 152. According to some embodiments, from a plan point of view, a boundary of the third mask layer 154 may have a shape in which a portion thereof is cut along a boundary of the first mask layer 136. For example, the boundary of the third mask layer 154 may have a shape recessed inward along the boundary of the first mask layer 136.

According to some embodiments, the second mask opening 172 may pass, penetrate, or extend through a portion of the interlayer insulating layer 134 in the vertical direction. For example, an upper surface of the second buffer layer 132 may not be exposed.

Figure 8A:
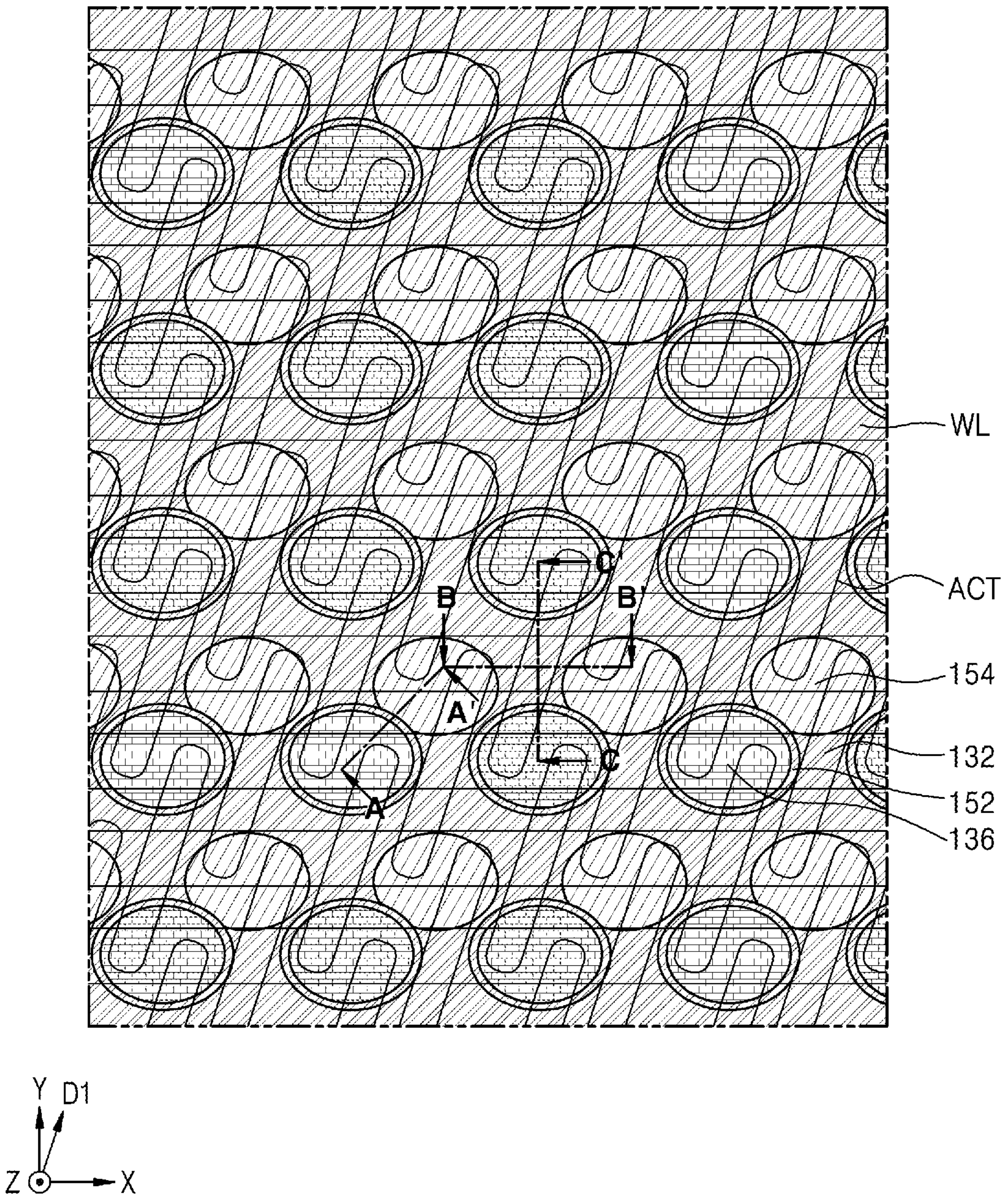
Figure 8B:
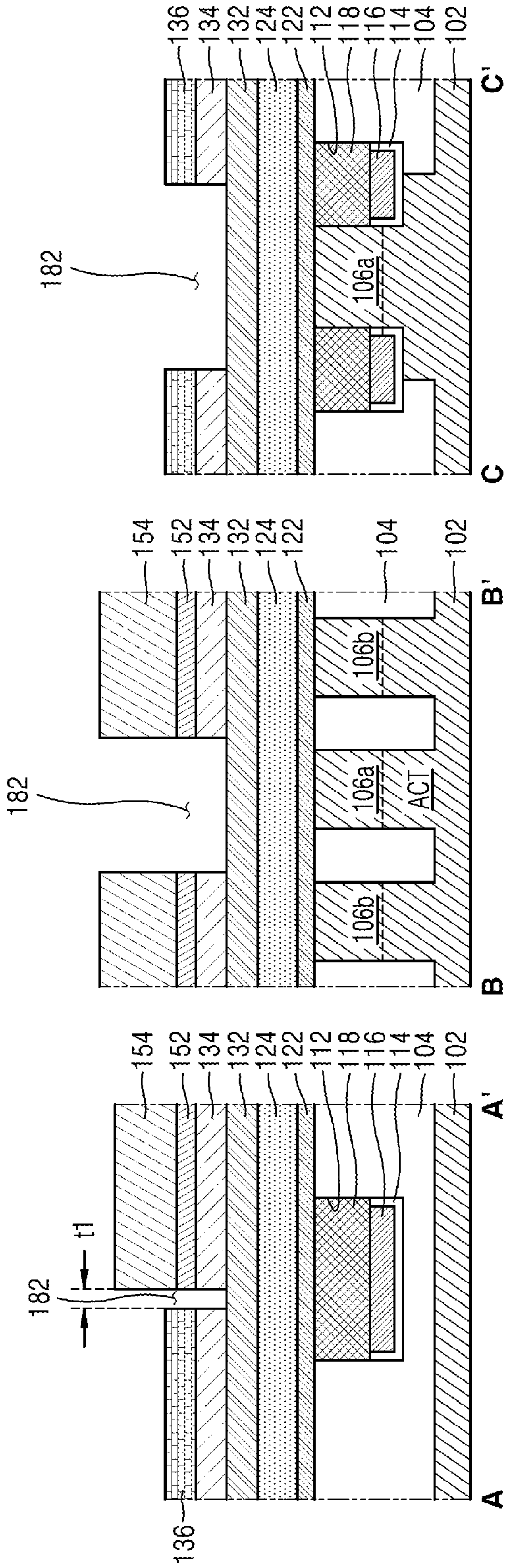

Referring to FIGS. 8A and 8B, a third mask opening 182 may be formed by removing the cell isolation layer 152 exposed through the second mask opening 172. In this case, the interlayer insulating layer 134 may be removed together, and thus a portion of the second buffer layer 132 may be exposed.

Figure 9:
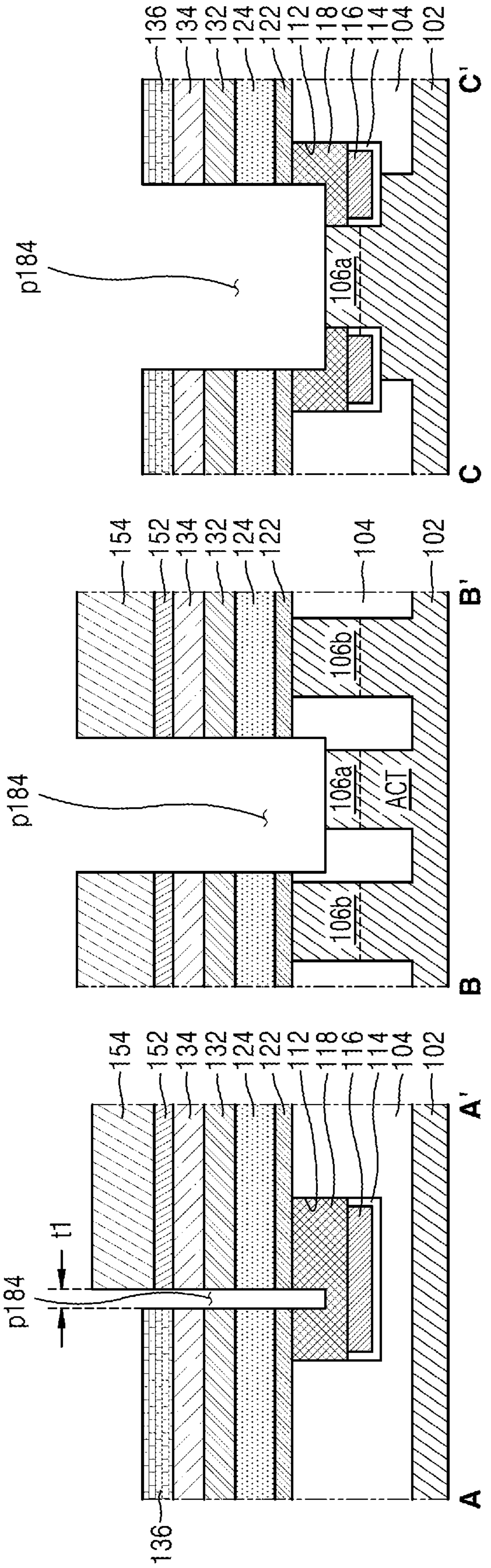

Referring to FIGS. 8A, 8B, and 9 together, a spare direct contact opening p184 may be formed by removing portions of the second buffer layer 132, the first conductive layer 124, and the first buffer layer 122 by using, as an etching mask, the first interlayer insulating layer 134, the cell isolation layer 152, the first mask layer 136, and the third mask layer 154 defining the third mask opening 182.

According to some embodiments, the spare direct contact opening p184 may pass, penetrate, or extend through portions of the first capping insulating layer 118, the first active region 106*a*, and the device isolation layer 104. According to some embodiments, the first active region 106*a* may be exposed through the spare direct contact opening p184.

Figure 10A:
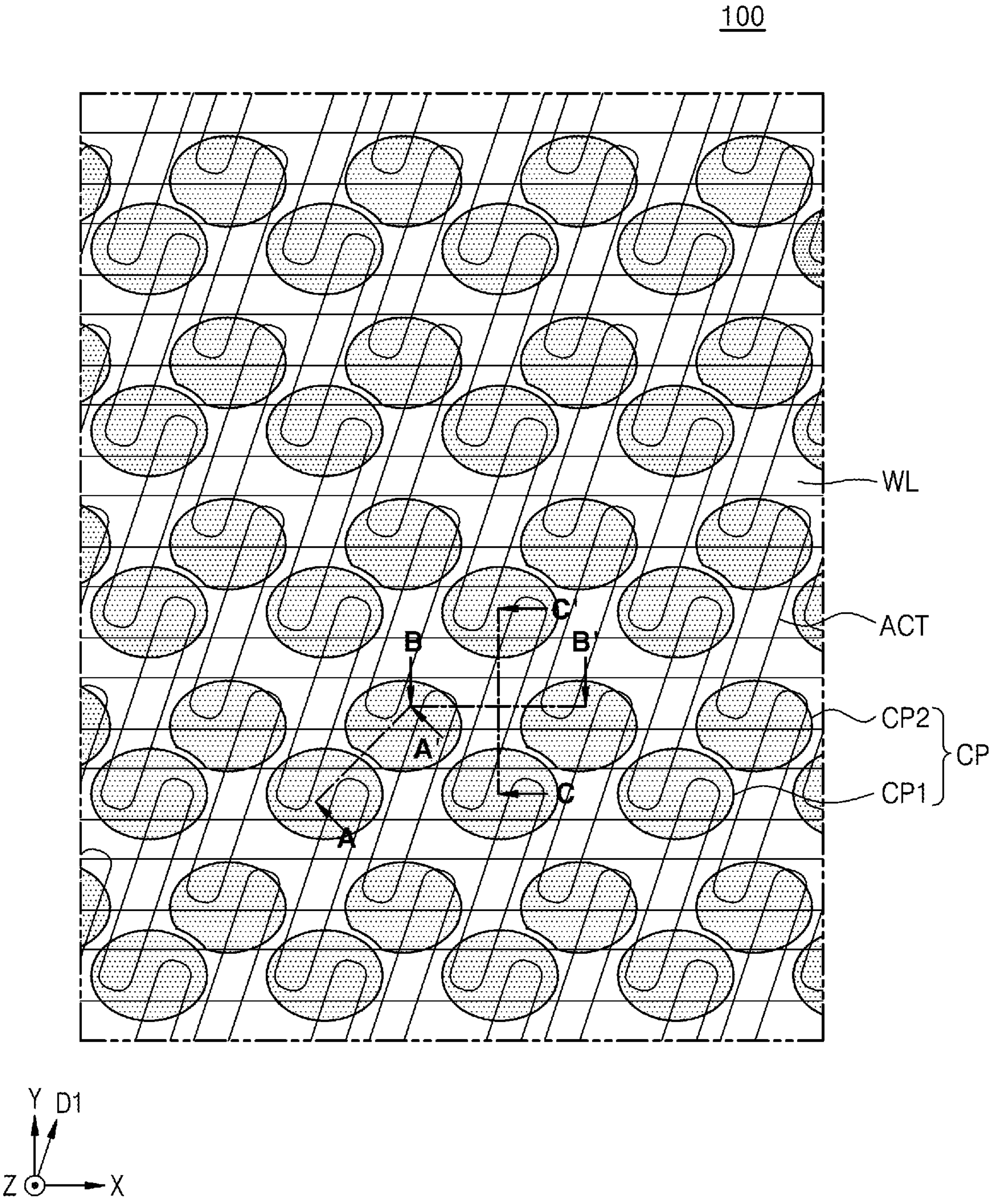
Figure 10B:
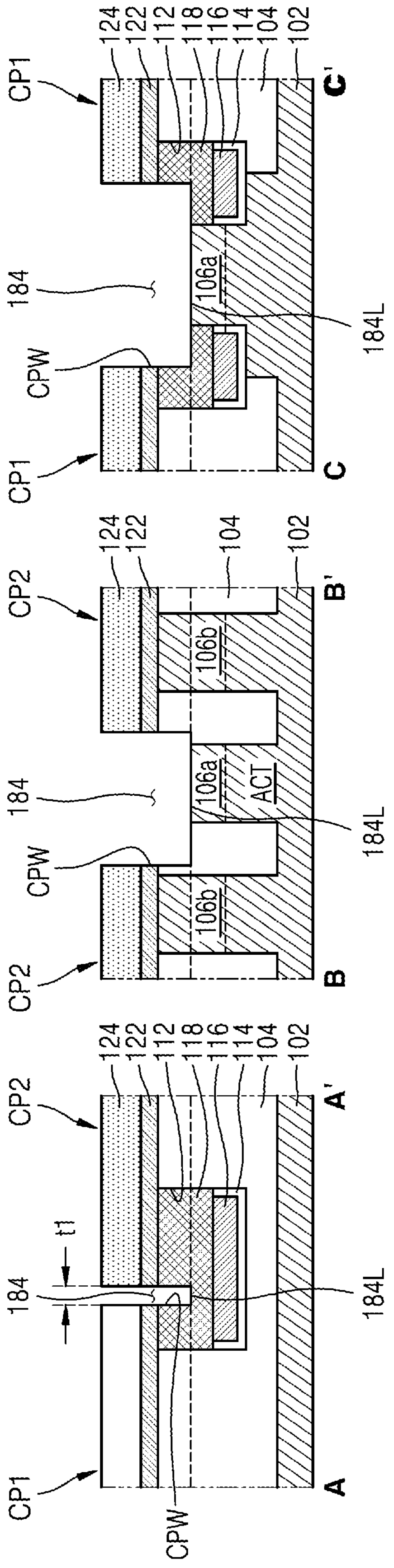

Referring to FIGS. 9, 10A, and 10B together, the first interlayer insulating layer 134, the cell isolation layer 152, the first mask layer 136, the third mask layer 154, and the second buffer layer 132 may be removed to expose an upper surface of the first conductive layer 124 and form a direct contact opening 184. Accordingly, a plurality of cell patterns CP, which define the direct contact opening 184 and have a pillar shape protruding from a lower surface 184L of the direct contact opening 184, may be defined. For example, the plurality of cell patterns CP may be unetched portions covered by the etching mask (e.g., the first interlayer insulating layer 134, the cell isolation layer 152, the first mask layer 136, and the third mask layer 154) in an operation of forming the spare direct contact opening p184, described with reference to FIG. 9. For example, the plurality of cell patterns CP may be portions remaining after the first interlayer insulating layer 134, the cell isolation layer 152, the first mask layer 136, the third mask layer 154, and the second buffer layer 132 are removed from among the etching masks (the first interlayer insulating layer 134, the cell isolation layer 152, the first mask layer 136, and the third mask layer 154).

According to some embodiments, a first cell pattern CP1 and a second cell pattern CP2 may be spaced apart from each other by the first separation distance t1.

Figure 11A:
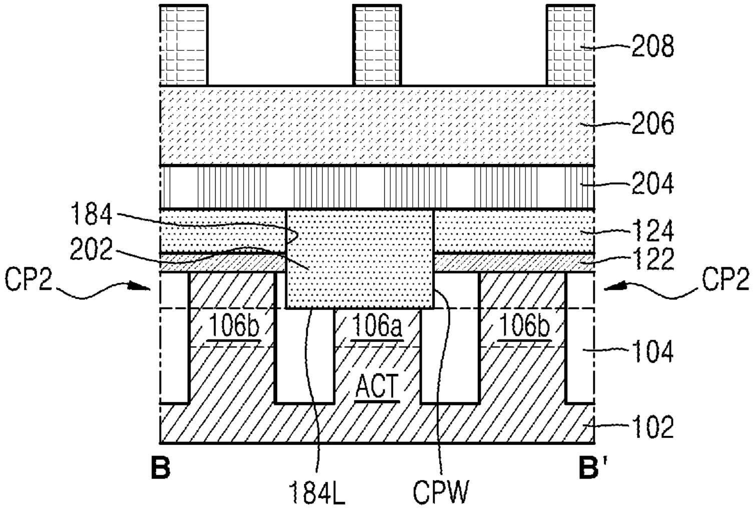
FIGS. 11A to 11C are cross-sectional views taken along line B-B' of FIG. 1A, for illustrating a method of manufacturing an integrated circuit device, according to some example embodiments.
Figure 11B:
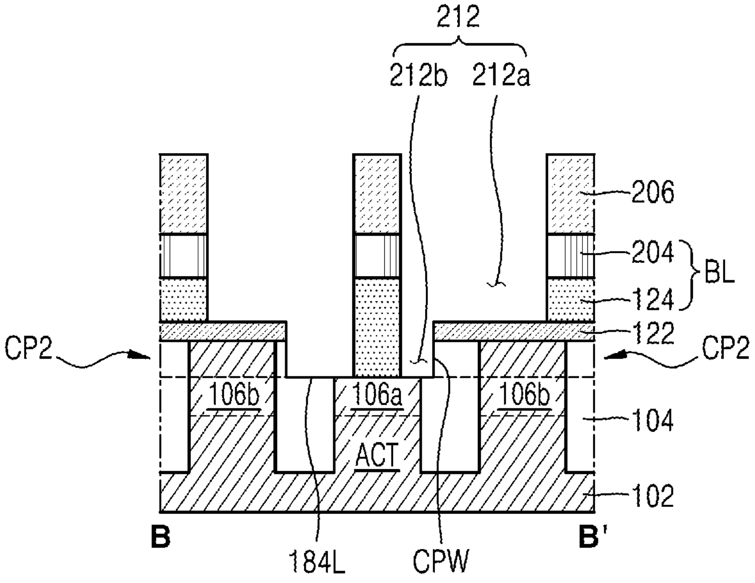
Figure 11C:
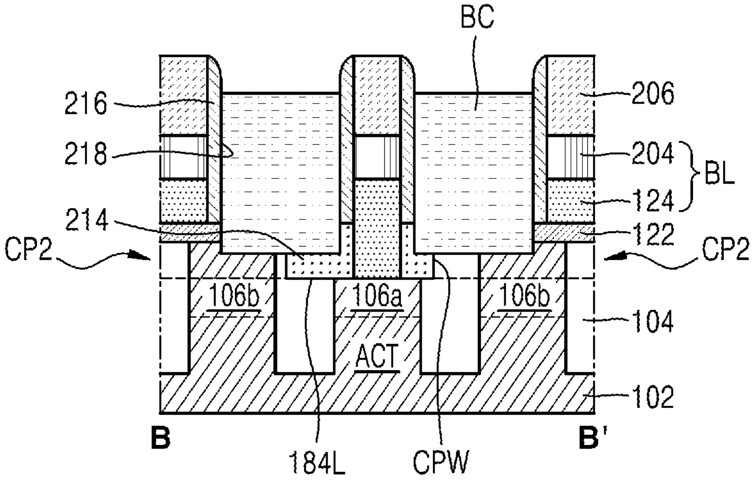

FIGS. 11A to 11C are cross-sectional views taken along line B-B' of FIG. 1A to illustrate a manufacturing sequence of the integrated circuit device (100) following the manufacturing method described with reference to FIGS. 10A and 10B.

Referring to FIG. 11A, a spare conductive layer 202 may be filled in a direct contact opening 184. Subsequently, a second conductive layer 204 and a second capping insulating layer 206 may be sequentially formed. A direct contact mask 208 for forming a direct contact DC may be disposed on the second capping insulating layer 206.

Referring to FIG. 11B, the direct contact DC and a buried contact opening 212 may be formed by removing portions of the spare conductive layer 202, a first conductive layer 124, a second conductive layer 204, and the second capping insulating layer 206 by using the direct contact mask 208 as an etching mask. The buried contact opening 212 may include a second sub opening 212*b* which is a space defined within the direct contact opening 184 by a plurality of cell patterns CP and the direct contact DC, and a first sub opening 212*a* which is a space defined on the first buffer layer 122 by the first conductive layer 124, the second conductive layer 204, and the second capping insulating layer 206.

Referring to FIG. 11C, after an insulating spacer 214 is filled in the second sub opening 212*b*, a composition for forming bitline spacers may be conformally coated on an upper surface of the second capping insulating layer 206, an upper surface of the insulating spacer 214, a side surface of the direct contact DC, and side surfaces of the first and second conductive layers 124 and 204 that are exposed. Subsequently, a recess portion 218 exposing an upper surface of a second active region 106*b* may be formed by recessing a space between a plurality of bitlines BL, thereby forming a bitline spacer 216 covering side surfaces of the bitlines BL and the second capping insulating layer 206.

Subsequently, a buried contact BC may be formed by filling the recessed space with a conductive material.

Referring to FIGS. 11C and 1B together, according to some embodiments, conductive landing pads 222 may be formed on the buried contact BC and the second capping insulating layer 206, and then a plurality of landing pad isolation patterns 224 may be formed between a plurality of conductive landing pads 222 adjacent to each other. According to some embodiments, a landing pad insulating layer 226 may be formed on the plurality of conductive landing pads 222 and the plurality of landing pad isolation patterns 224, and a via plug 228 passing, penetrating, or extending through the landing pad insulating layers 226 may be formed. Subsequently, a capacitor 232 may be formed on the landing pad insulating layer 226, and may be connected to the conductive landing pad 222 through the via plug 228.

As described above, example embodiments have been shown in the drawings and description. Although the embodiments have been described by using particular terms herein, the terms are used only for describing the inventive concept and are not used to restrict a meaning or limit the scope of the inventive concept defined by the appended claims. While the inventive concept has been particularly shown and described with reference to embodiments thereof, it will be understood that various changes in form and details may be made therein without departing from the scope of the following claims.

What is claimed is:

1. An integrated circuit device comprising:

a substrate that has a first active region and a second active region spaced apart from the first active region;

a device isolation layer between the first active region and the second active region;

a direct contact electrically connected to the first active region in a direct contact opening that extends through portions of the first active region and the device isolation layer;

a plurality of cell patterns that have a pillar shape and extend from a lower surface of the direct contact opening on the second active region; and a buried contact plug that extends through portions of the plurality of cell patterns and is electrically connected to the second active region, wherein the plurality of cell patterns comprise:

a plurality of first cell groups that are arranged along a first horizontal direction and each comprise a plurality of first cell patterns arranged in a row along a second horizontal direction perpendicular to the first horizontal direction; and a plurality of second cell groups that are spaced apart from the plurality of first cell groups, are arranged along the first horizontal direction, and each comprise a plurality of second cell patterns arranged in a row along the second horizontal direction, and wherein respective side surfaces of the plurality of second cell patterns have respective concave portions that are recessed from a planar area in a plan view of each of the plurality of second cell patterns inward along respective side surfaces of the plurality of first cell patterns that are adjacent to respective ones of the plurality of second cell patterns.

2. The integrated circuit device of claim 1, wherein the concave portions of the respective side surfaces of the plurality of second cell patterns are spaced apart from the plurality of first cell patterns that are adjacent thereto by a first separation distance, and the plurality of first cell patterns and the plurality of second cell patterns are spaced apart from each other by at least the first separation distance.

3. The integrated circuit device of claim 1, wherein each of the side surfaces of the plurality of second cell patterns has two concave portions.

4. The integrated circuit device of claim 1, wherein the plurality of first cell patterns and the plurality of second cell patterns surround each other in a plan view, and at least two first cell patterns from among the plurality of first cell patterns that surround a second cell pattern from among the plurality of second cell patterns have different distances from the second cell pattern.

5. The integrated circuit device of claim 1, wherein the plurality of first cell patterns are equally spaced apart from each other in the first horizontal direction and in the second horizontal direction to form first cell matrices, wherein the plurality of second cell patterns are equally spaced apart from each other in the first horizontal direction and in the second horizontal direction to form second cell matrices that intersect the first cell matrices.

6. The integrated circuit device of claim 5, wherein, in a plan view, four second cell patterns from among the plurality of second cell patterns surround a first cell pattern from among the plurality of first cell patterns and are asymmetrical with respect to the first cell pattern.

7. The integrated circuit device of claim 5, wherein a distance between adjacent ones of the plurality of first cell patterns is equal to a distance between adjacent ones of the plurality of second cell patterns.

8. The integrated circuit device of claim 1, wherein the planar area of each of the plurality of second cell patterns is less than a planar area of each of the plurality of first cell patterns.

9. The integrated circuit device of claim 1, wherein the plurality of cell patterns surround the direct contact in a plan view, and at least two cell patterns from among the plurality of cell patterns that surround the direct contact have different distances from the direct contact.

10. The integrated circuit device of claim 1, further comprising:

a plurality of wordlines that are on the substrate, and are in a plurality of wordline trenches that extend in the first horizontal direction, wherein the plurality of cell patterns overlap portions of the plurality of wordlines in a vertical direction.

11. An integrated circuit device comprising:

a substrate that has a plurality of first active regions and a plurality of second active regions;

a plurality of cell patterns that define a direct contact opening on one or more of the second active regions, include a plurality of first cell patterns that are arranged in a first horizontal direction and a second horizontal direction perpendicular to the first horizontal direction, and include a plurality of second cell patterns that are arranged in the first horizontal direction and the second horizontal direction and are spaced apart from the first cell patterns;

a direct contact that extends through a gap-fill insulating pattern in the direct contact opening, and is electrically connected to one or more of the first active regions;

a bitline that is electrically connected to the direct contact on the substrate; and a buried contact plug that extends through portions of the plurality of cell patterns, and is electrically connected to one or more of the second active regions, wherein the plurality of second cell patterns are spaced apart from the plurality of first cell patterns that are adjacent thereto by at least a first separation distance, and wherein a planar area of each of the plurality of second cell patterns is less than a planar area of each of the plurality of first cell patterns.

12. The integrated circuit device of claim 11, wherein four adjacent first cell patterns have a first rectangular arrangement structure and surround a second cell pattern from among the plurality of second cell patterns in a plan view, the second cell pattern is offset from a center of the first rectangular arrangement structure, and wherein four adjacent second cell patterns have a second rectangular arrangement structure and surround a first cell pattern from among the plurality of first cell patterns in the plan view, and the first cell pattern is offset from a center of the second rectangular arrangement structure.

13. The integrated circuit device of claim 12, wherein a distance in the first horizontal direction between adjacent ones of the plurality of first cell patterns is equal to a distance in the first horizontal direction between adjacent ones of the plurality of second cell patterns, and a distance in the second horizontal direction between adjacent ones of the plurality of first cell patterns is equal to a distance in the second horizontal direction between adjacent ones of the plurality of second cell patterns.

14. The integrated circuit device of claim 11, wherein, from a plan view, respective side surfaces of the plurality of second cell patterns include respective recessed portions that are adjacent to corresponding side surfaces of the plurality of first cell patterns.

15. The integrated circuit device of claim 14, wherein the direct contact is surrounded by the plurality of first cell patterns and the plurality of second cell patterns in the plan view, and the plurality of first cell patterns and the plurality of second cell patterns that surround the direct contact are asymmetric with respect to the direct contact.

16. An integrated circuit device comprising:

a substrate that has a first active region and a second active region spaced apart from the first active region;

a device isolation layer between the first active region and the second active region;

a direct contact electrically connected to the first active region in a direct contact opening that extends through portions of the first active region and the device isolation layer;

a wordline that extends in a first horizontal direction on the substrate, and intersects the first active region and the second active region;

a bitline that extends in a second horizontal direction perpendicular to the first horizontal direction on the substrate and is electrically connected to the direct contact;

a capacitor that is on the bitline and is configured to store data;

a plurality of cell patterns that have a pillar shape and extend from a lower surface of the direct contact opening on the second active region, and define the direct contact opening;

a buried contact plug that extends through portions of the plurality of cell patterns, and is electrically connected to the second active region; and a conductive landing pad that extends in a vertical direction on the buried contact plug, and electrically connects the buried contact plug and the capacitor to each other, wherein the plurality of cell patterns comprise:

a plurality of first cell groups that are arranged along the first horizontal direction and each comprise a plurality of first cell patterns arranged in a row along the second horizontal direction; and a plurality of second cell groups that are spaced apart from the plurality of first cell groups, are arranged along the first horizontal direction, and each comprise a plurality of second cell patterns arranged in a row along the second horizontal direction, wherein a planar area of each of the plurality of second cell patterns is less than a planar area of each of the plurality of first cell patterns, and wherein the plurality of second cell patterns are spaced apart from the plurality of first cell patterns that are adjacent thereto by at least a first separation distance.

17. The integrated circuit device of claim 16, wherein the plurality of second cell patterns are respectively spaced apart from two first cell patterns that are adjacent thereto from among the plurality of first cell patterns by the first separation distance.

18. The integrated circuit device of claim 16, wherein, from a plan view, respective side surfaces of the plurality of second cell patterns have respective concave portions recessed inward along respective side surfaces of the plurality of first cell patterns that are adjacent to respective ones of the plurality of second cell patterns.

19. The integrated circuit device of claim 16, wherein the plurality of first cell patterns and the plurality of second cell patterns surround each other in a plan view, and at least two first cell patterns from among the plurality of first cell patterns that surround a second cell pattern from among the plurality of second cell patterns have different distances from the second cell pattern.

20. The integrated circuit device of claim 16, wherein the plurality of first cell patterns that comprise the first cell groups are spaced apart from each other by a same first distance, the plurality of second cell patterns that comprise the second cell groups are spaced apart from each by a same second distance, and the first distance is equal to the second distance.

* * * * *